(12) United States Patent
Shafer et al.

(10) Patent No.: US 7,712,905 B2
(45) Date of Patent: May 11, 2010

(54) IMAGING SYSTEM WITH MIRROR GROUP

(75) Inventors: David Shafer, Fairfield, CT (US);
Aurelian Dodoc, Oberkochen (DE);
Alexander Epple, Aalen (DE);
Hans-Juergen Mann, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 575 days.

(21) Appl. No.: 11/578,098

(22) PCT Filed: Mar. 22, 2005

(86) PCT No.: PCT/EP2005/003032

§ 371 (c)(1),
(2), (4) Date: Aug. 13, 2007

(87) PCT Pub. No.: WO2005/098504

PCT Pub. Date: Oct. 20, 2005

(65) Prior Publication Data

US 2008/0213703 A1 Sep. 4, 2008

Related U.S. Application Data

(60) Provisional application No. 60/560,267, filed on Apr. 8, 2004.

(51) Int. Cl.
*G02B 5/08* (2006.01)

(52) U.S. Cl. ...................................... 359/857; 359/850

(58) Field of Classification Search .................. 359/850, 359/857, 858, 859, 861, 864, 869, 365, 366
See application file for complete search history.

(56) References Cited

U.S. PATENT DOCUMENTS 5,515,207 A 5/1996 Foo et al.

(Continued)

FOREIGN PATENT DOCUMENTS

EP 1 069 448 A 1/2001

(Continued)

OTHER PUBLICATIONS

David R. Shafer, "Anastigmatic Two-Mirror Telescopes: Some New Types", Applied Optics USA, vol. 16, No. 5 May 1977 pp. 1178-1180.

(Continued)

*Primary Examiner*—Euncha P Cherry
(74) *Attorney, Agent, or Firm*—Sughrue Mion, PLLC

(57) ABSTRACT

An imaging system for imaging an off-axis object field arranged in an object surface of the imaging system onto an off-axis image field arranged in an image surface of the imaging system while creating at least one intermediate image has: an optical axis; an in-line mirror group having an object side mirror group entry, an image side mirror group exit and a mirror group plane aligned transversely to the optical axis and arranged geometrically between the mirror group entry and the mirror group exit, the mirror group including: a first mirror having a first mirror surface for receiving radiation coming from the object surface in a first reflecting area asymmetric to the optical axis; at least one second mirror having a second mirror surface facing the first mirror surface for receiving radiation coming from the first mirror in a second reflecting area asymmetric to the optical axis; at least one of the first and second mirrors being a concave mirror having a concave mirror surface defining a mirror axis on the optical axis; wherein the mirrors of the mirror group are arranged such that radiation coming from the mirror group entry passes at least four times through the mirror group plane and is reflected at least twice on a concave mirror surface of the mirror group prior to exiting the mirror group at the mirror group exit. A strong overcorrection of image field curvature can be effected in an axially compact design.

31 Claims, 15 Drawing Sheets

U.S. PATENT DOCUMENTS

| | | |
|---|---|---|
| 6,600,608 B1 | 7/2003 | Shafer et al. |
| 6,860,610 B2 * | 3/2005 | Terasawa .................... 359/857 |
| 2002/0024741 A1 | 2/2002 | Terasawa et al. |
| 2002/0057424 A1 | 5/2002 | Shima |
| 2003/0234992 A1 * | 12/2003 | Shafer ........................ 359/850 |
| 2004/0027653 A1 | 2/2004 | Shafer et al. |
| 2004/0130806 A1 | 7/2004 | Takahashi |
| 2005/0190435 A1 | 9/2005 | Shafer et al. |

FOREIGN PATENT DOCUMENTS

| | | |
|---|---|---|
| EP | 1 335 228 A | 8/2003 |
| EP | 1 336 887 A | 8/2003 |
| EP | 1 413 909 A | 4/2004 |
| JP | 2002-208551 A | 7/2002 |
| JP | 2003 15040 A | 1/2003 |
| JP | 2003 114387 A | 4/2003 |
| WO | WO 01/55767 A2 | 8/2001 |

OTHER PUBLICATIONS

Erhard Glatzel, "New Lenses for Microlithography", SPIE vol. 237, 1980 International Lens Design Conference (OSA) pp. 310-320.

Shafer D. R.; "Anastigmatic Two-Mirror Telescopes: Some New Types" Applied Optics USA, vol. 16, No. 5, May 1977, pp. 1178-1180.

* cited by examiner

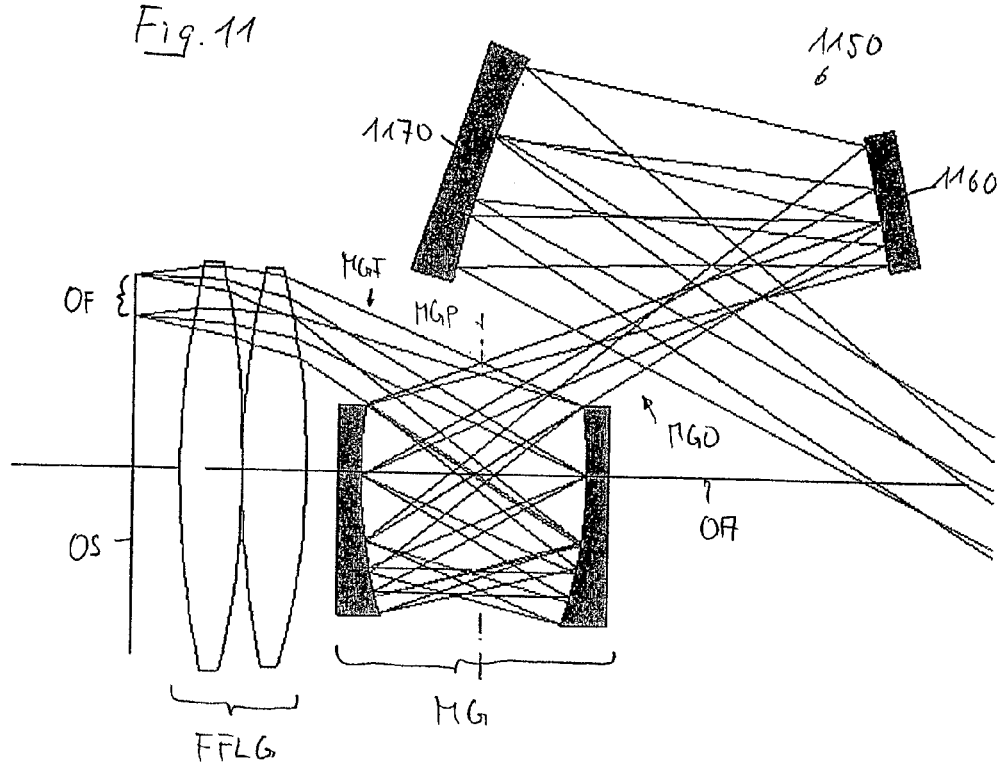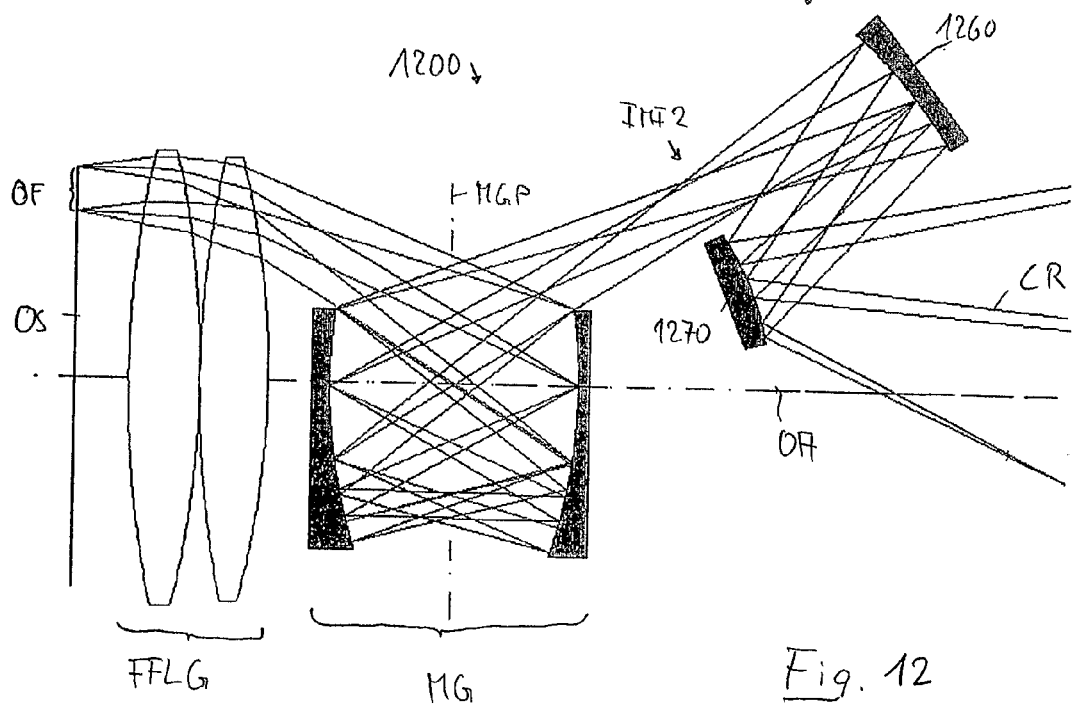

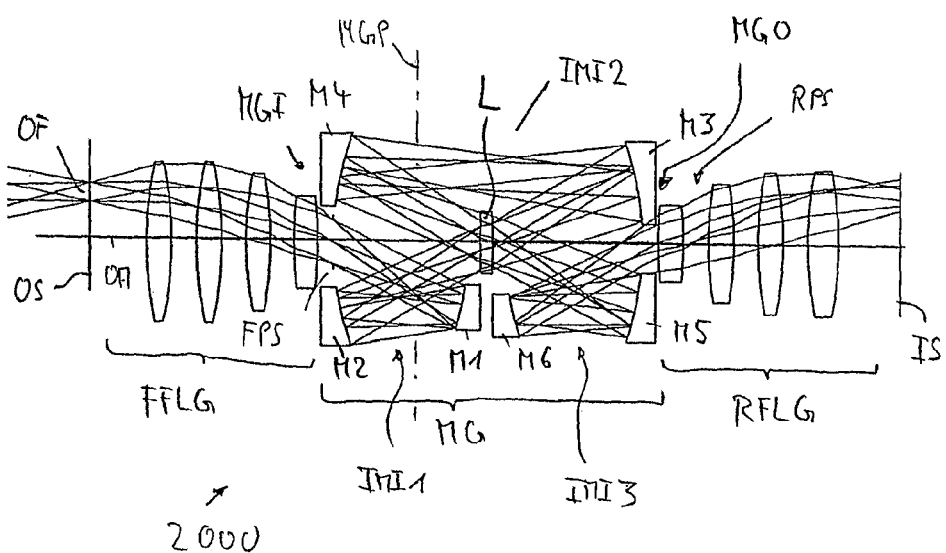

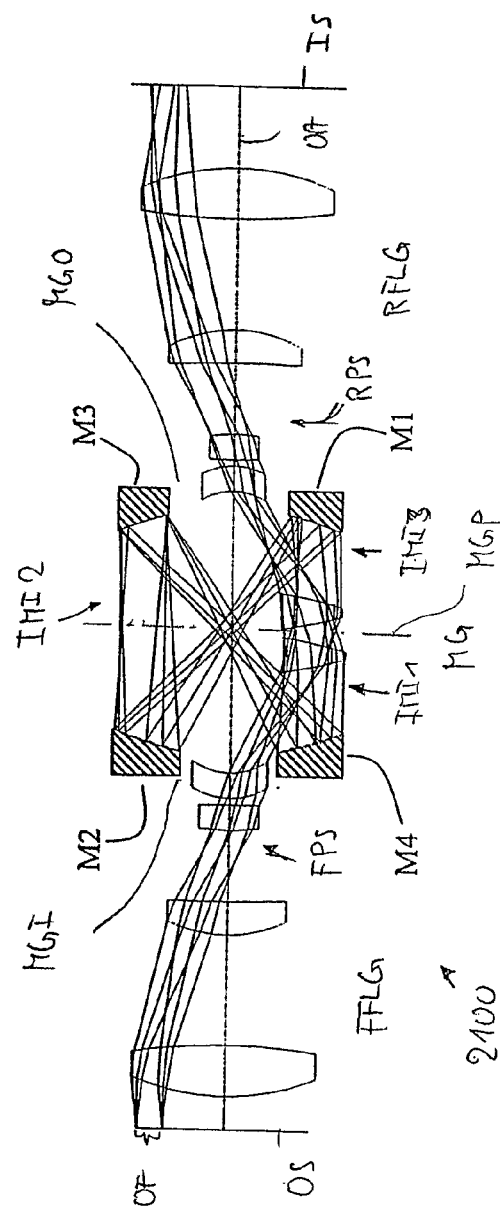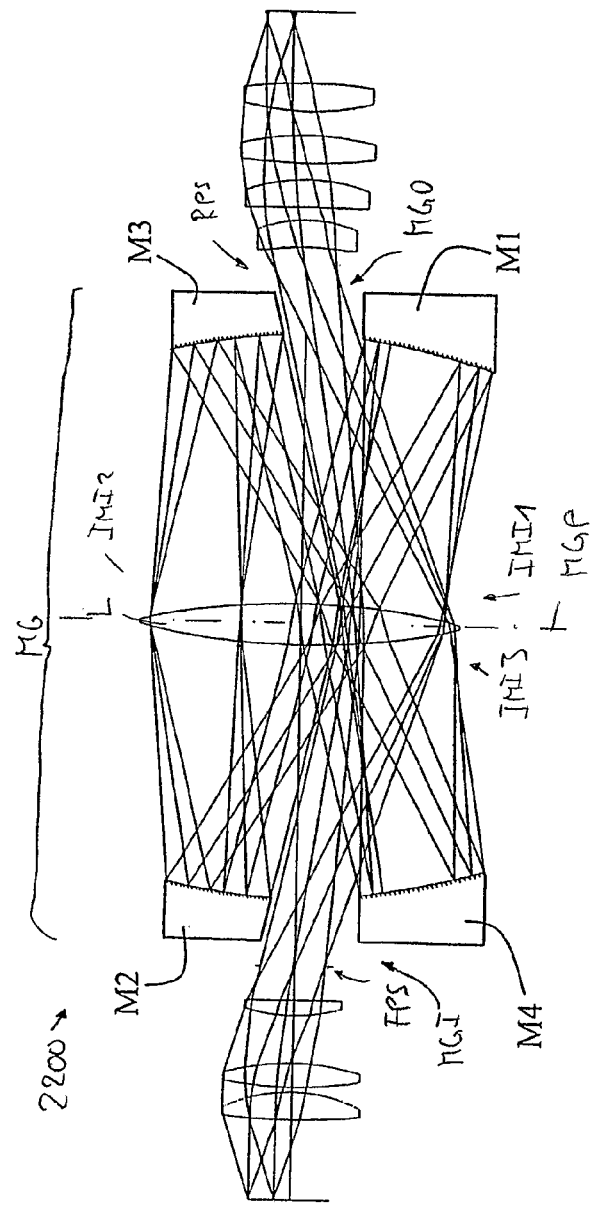

IMAGING SYSTEM WITH MIRROR GROUP

This application claims the benefit of U.S. provisional application 60/560,267 filed on Apr. 8, 2004. The complete disclosure of that provisional application is incorporated into this application by reference.

BACKGROUND OF THE INVENTION

1. Field of the Invention

The invention relates to an imaging system for imaging an object field arranged in an object surface of the imaging system onto an image field arranged in an imaging surface of the imaging system while creating at least one intermediate image. In a preferred field of application the imaging system is designed as a catadioptric projection objective for a microlithographic projection exposure system designed for projection using radiation in the ultraviolet spectrum or as an integral part thereof.

2. Description of the Related Art

Catadioptric projection objectives are, for example, employed in projection exposure systems, in particular wafer scanners or wafer steppers, used for fabricating semiconductor devices and other types of microdevices and serve to project patterns on photomasks or reticles, hereinafter referred to generically as "masks" or "reticles," onto an object having a photosensitive coating with ultrahigh resolution on a reduced scale.

In order create even finer structures, it is sought to both increase the image-end numerical aperture (NA) of the projection objective to be involved and employ shorter wavelengths, preferably ultraviolet light with wavelengths less than about 260 nm. However, there are very few materials, in particular, synthetic quartz glass and crystalline fluorides, that are sufficiently transparent in that wavelength region available for fabricating the optical elements required. Since the Abbe numbers of those materials that are available lie rather close to one another, it is difficult to provide purely refractive systems that are sufficiently well color-corrected (corrected for chromatic aberrations).

The high prices of the materials involved and limited availability of crystalline calcium fluoride in sizes large enough for fabricating large lenses represent problems, particularly in the field of microlithography at 157 nm for very large numerical apertures, NA, of, for example, NA=0.80 and larger. Measures that will allow reducing the number and sizes of lenses employed and simultaneously contribute to maintaining, or even improving, imaging fidelity are thus desired.

In optical lithography, high resolution and good correction status have to be obtained for a relatively large, virtually planar image field. It has been pointed out that the most difficult requirement that one can ask of any optical design is that it have a flat image, especially if it is an all-refractive design. Providing a flat image requires opposing lens powers and that leads to stronger lenses, more system length, larger system glass mass, and larger higher-order image aberrations that result from the stronger lens curvatures. Conventional means for flattening the image field, i.e. for correctings the Petzval sum in projection objectives for microlithography are discussed in the article "New lenses for microlithography" by E. Glatzel, SPIE Vol. 237 (1980), pp. 310-320.

Concave mirrors have been used for some time to help solve problems of color correction and image flattening. A concave mirror has positive power, like a positive lens, but the opposite sign of Petzval curvature. Also, concave mirrors do not introduce color problems.

In view of the aforementioned problems, catadioptric systems that combine refracting and reflecting elements, i.e., in particular, lenses and concave mirrors, are primarily employed for configuring high-resolution projection objectives of the aforementioned type.

Unfortunately, a concave mirror is difficult to integrate into an optical design, since it sends the radiation right back in the direction it came from. Intelligent designs integrating concave mirrors without causing mechanical problems or problems due to beam vignetting or obscuration are desirable.

Catadioptric projection objectives having one common straight optical axis and at least two concave mirrors have been proposed to provide systems with good color correction and moderate lens mass requirements. The U.S. Pat. No. 6,600,608 B1 discloses a catadioptric projection objective having a first, purely refractive objective part for imaging a pattern arranged in the object plane of the projection objective into a first intermediate image, a second objective part for imaging the first intermediate image into a second intermediate image and a third objective part for imaging the second intermediate image directly, that is without a further intermediate image, onto the image plane. The second objective part is a catadioptric objective part having a first concave mirror with a central bore and a second concave mirror with a central bore, the concave mirrors having the mirror faces facing each other and defining an intermirror space or catadioptric cavity in between. The first intermediate image is formed within the central bore of the concave mirror next to the object plane, whereas the second intermediate image is formed within the central bore of the concave mirror next to the object plane. The objective has axial symmetry and a field centered around the optical axis and provides good color correction axially and laterally. However, since the reflecting areas of the concave mirrors exposed to the radiation are interrupted at the bores, the pupil of the system is obscured.

The Patent EP 1 069 448 B1 discloses catadioptric projection objectives having two concave mirrors facing each other and an off-axis object and image field. The concave mirrors are part of a first catadioptric objective part imaging the object onto an intermediate image positioned adjacent to a concave mirror. This is the only intermediate image, which is imaged to the image plane by a second, purely refractive objective part. The object as well as the image of the catadioptric imaging system are positioned outside the intermirror space defined by the mirrors facing each other. Similar systems having two concave mirrors, a common straight optical axis and one intermediate image formed by a catadioptric imaging system and positioned besides one of the concave mirrors are disclosed in Japanese patent application JP 2002208551 A and US patent application US 2002/0024741.

US patent application US 2004/0130806 (corresponding to European patent application EP 1 336 887) discloses catadioptric projection objectives having off-axis object and image field, one common straight optical axis and, in that sequence, a first catadioptric objective part for creating a first intermediate image, a second catadioptric objective part for creating a second intermediate image from the first intermediate image, and a refractive third catadioptric objective part forming the image from the second intermediate image. Each catadioptric system has two concave mirrors facing each other. The intermediate images lie outside the intermirror spaces defined by the concave mirrors.

Japanese patent application JP 2003114387 A and international patent application WO 01/55767 A disclose catadioptric projection objectives with off-axis object and image field having one common straight optical axis, a first catadioptric objective part for forming an intermediate image and a second catadioptric objective part for imaging the intermediate image onto the image plane of this system. Concave and convex mirrors are used in combination.

US patent application US 2003/0234992 A1 discloses catadioptric projection objectives with off-axis object and image field having one common straight optical axis, a first catadioptric objective part for forming an intermediate image, and a second catadioptric objective part for imaging the intermediate image onto the image plane. In each catadioptric objective part concave and convex mirrors are used in combination with one single lens.

U.S. provisional application with Ser. No. 60/536,248 filed on Jan. 14, 2004 by the applicant and published from non-provisional application Ser. No. 11/035,103 on Sep. 1, 2005 as US 2005/0190435A1 discloses a catadioptric projection objective having very high NA and suitable for immersion lithography at NA>1. The projection objective comprises: a first objective part for imaging the pattern provided in the object plane into a first intermediate image, a second objective part for imaging the first intermediate imaging into a second intermediate image, and a third objective part for imaging the second intermediate imaging directly onto the image plane. The second objective part includes a first concave mirror having a first continuous mirror surface and a second concave mirror having a second continuous mirror surface, the concave mirror faces facing each other and defining an intermirror space. At least the first intermediate image, preferably both intermediate images, are located geometrically within the intermirror space. The system has potential for very high numerical apertures at moderate lens mass consumption. The full disclosure of this document is incorporated into this application by reference.

SUMMARY OF THE INVENTION

It is one object of the invention to provide an imaging system that can be built with relatively small amounts of transparent optical material. It is another object of the invention to provide an optical imaging system which can be used as or allows to provide a catadioptric projection objective for microlithography suitable for use in the vacuum ultraviolet (VUV) range having potential for very high image side numerical aperture which may extend to values allowing immersion lithography at numerical apertures NA>1. It is another object of the invention to provide an imaging system having an axially compact arrangement of mirrors effective for compensating image curvature abberations caused by lenses with positive power within the imaging system.

As a solution to these and other objects the invention, according to one formulation, provides an imaging system for imaging an off-axis object field arranged in an object surface of the imaging system onto an off-axis image field arranged in an image surface of the imaging system while creating at least one intermediate image comprising:

an optical axis;

at least one mirror group having an object side mirror group entry, an image side mirror group exit, and a mirror group plane aligned transversly to the optical axis and arranged geometrically between the mirror group entry and the mirror group exit, the mirror group including:

a first mirror having a first mirror surface for receiving radiation coming from the mirror group entry in a first reflecting area;

at least one second mirror having a second mirror surface facing the first mirror surface for receiving radiation coming from the first mirror in a second reflecting area;

at least one of the first and second mirrors being a concave mirror having a concave mirror surface having a surface of curvature defining a mirror axis on the optical axis;

wherein the mirrors of the mirror group are arranged such that at least one intermediate image is positioned inside the mirror group between mirror group entry and mirror group exit, and that radiation coming from the mirror group entry passes at least four times through the mirror group plane and is reflected at least twice on a concave mirror surface of the mirror group prior to exiting the mirror group at the mirror group exit.

Since the radiation entering the mirror group is reflected at least twice on a concave mirror surface before exiting the mirror group, the mirror group can provide strong overcorrection of the Petzval sum, which can at least partly compensate opposite effects on image curvature caused by positive refractive power upstream and/or downstream of the mirror group. The mirror group can, therefore, be regarded as a "Petzval sum corrector". At least one intermediate image is formed within the mirror group. Further, since the radiation is reflected back and forth within the mirror group such that the radiation passes the mirror plane more than three times, a multitude of reflections can be obtained within an axially compact space defined between the mirror group entry and the mirror group exit. The mirror group plane may be a plane perpendicular to the optical axis and positioned between the vertices of the first and the second mirror of the mirror group.

It is possible to design the mirror group such that a Petzval sum of the mirror group exceeds a suitable threshold value, particularly such that the major part of Petzval overcorrection present in the entire system in provided by the mirror group. Therefore other parts of the imaging systems need no means for Petzval sum correction or only moderate means for Petzval sum correction.

For the purpose of this application the Petzval sum is defined by $$PETZ = \sum_i \Phi_i / n_i,$$

where $\Phi_i$ is the element power of element i and n is the index of refraction of the element i. The reciprocal of a Petzval sum is the image radius of curvature. Therefore, the lower the Petzval sum, the lower will be the curvature of the image surface.

In some embodiments, a length ratio LR between an axial mirror group length MGL and a total track length TT of the imaging system is less than 50%, where the mirror group length is the axial distance between a mirror vertex closest to the object surface and a mirror vertex closest to the image surface and the total track length is the axial distance between object surface anf image surface. Preferably LR=MGL/TT is less than 40% or less than 30%, indicating axially compact mirror groups allowing to integrate strong Petzval correction in optical designs with moderate track length.

In some embodiments the mirror group includes a first mirror for receiving radiation from the mirror group entry on a first reflecting area; a second mirror for receiving radiation reflected from the first mirror on a second reflecting area; a third mirror for receiving radiation reflected from the second mirror on a third reflecting area; and a fourth mirror for receiving radiation reflected from the third mirror in a fourth reflecting area and for reflecting the radiation to the mirror group exit. In these embodiments, exactly four reflections occur within the mirror group providing a good compromise between a desired influence of reflections of the field curvature and an undesired loss of intensity involved with each reflection on a mirror.

In some embodiments of this type the first, second, third and fourth mirror is a concave mirror, thus providing four reflections on concave mirror surfaces. Strong Petzval overcorrection can be obtained this way since each reflection contributes a certain amount of Petzval overcorrection.

In other embodiments of this type, the first and third mirrors are planar mirrors and the second and fourth mirror is a concave mirror. Alternatively, the second and fourth mirror may be a planar mirror whereas the first and the third mirror is a concave mirror. Mirror groups having at least one planar mirror surface for reflecting radiation coming from one concave reflecting area to another concave reflecting area can be preferable from a manufacturing point of view since planar mirrors can be provided with high quality at relatively low cost when compared to concave mirrors.

Mirror groups providing less than four reflections, e.g. two or three reflections, are also possible. Two or more mirror groups can be combined in an imaging system to increase the correcting effect on image curvature of the mirror groups. Therefore, more than four reflections, e.g. five or six reflections between object surface and image surface are also possible.

According to one embodiment the mirror group includes at least one mirror pair consisting of two concave mirrors having mirror surfaces sharing a common surface of curvature provided on a common mirror substrate having a transmissive portion or aperture provided between the concave mirrors of the mirror pair. The concave mirrors of a mirror pair may also be described as a concave mirror having a transmissive aperture wherein non-overlapping reflecting areas of the mirror on both sides of the aperture are used. The transmissive aperture is effective to allow radiation to enter or exit an intermirror space axially defined by the mirror pair on one side and one or more mirrors on the other side.

The aperture may be arranged eccentrically to the optical axis. The aperture may be formed by a hole or bore in a mirror substrate. It is also possible that the mirrors of the mirror pair are formed by coated areas on a transparent substrate coated with a reflective coating such that the coated areas are spaced part from each other leaving a transmissive portion or aperture on the substrate surface in between. A mirror pair formed by concave mirrors having a common surface of curvature may facilitate manufacturing and mounting of the concave mirrors.

According to one embodiment the mirror group is designed such that at least one mirror surface is used twice at reflecting areas overlapping at least partially. Mirrors used this way will be denoted "multiply reflecting mirrors" in the following. A multiply reflecting mirror includes reflecting surface elements which are used twice at two consecutive reflections by the beam passing through the mirror group. The reflecting areas (footprints) at the consecutive reflections will normally have different sizes and shapes depending on the optical construction upstream of the reflection. Designing the mirror group to allow multiple reflections allows to design a mirror group having a number of mirrors which is less than the number of reflections within the mirror group, e.g. having only two or three mirrors, but four reflections. Compact designs having strong effect on image curvature are possible this way. The multiply used mirror surface may be planar or concave.

In one embodiment only two concave mirrors are provided, each being arranged to be used as a multiply reflecting mirror such that four reflections within the mirror group are possible with only two concave mirrors. A mirror group effective this way may include an object side concave mirror having a mirror surface facing the image side and an image side concave mirror having a mirror surface facing the object side, the object side concave mirror and the image side concave mirror sharing a common mirror axis and being arranged eccentrically to the optical axis such that the mirror group entry is positioned besides the object side concave mirror and the mirror group exit is positioned besides the image side concave mirror on the same side as the mirror group entry. The concave mirrors may be arranged such that radiation entering the mirror group obliquely to the optical axis at the mirror group entry is reflected twice on the object side concave mirror and twice on the image side concave mirror prior to exiting the mirror group at the mirror group exit.

One or more mirrors of the mirror group may be constructed as front face mirrors having a mirror substrate and a reflective coating on the mirror substrate, wherein the reflection occurs on the coating side opposite to the substrate side. It is also possible to construct one or more mirrors of the mirror group as a rear face mirror, wherein a transparent substrate is coated with a reflection coating and the reflection occurs on the substrate side of the reflection coating.

In one embodiment the mirror group includes at least one substrate of transparent material having at least one convex surface coated with a reflection coating in at least one coating area such that the reflection coating forms a concave mirror for radiation impinging on the coating area from the substrate side.

Preferably, the mirror group includes a substrate of transparent material having an object side surface and an image side surface, at least one of the object side surface and the image side surface being convex, wherein the object side surface and the image side surface is coated with a reflective coating in at least one coating area such that the coating area forms a mirror, wherein all mirrors of the mirror group are formed by coating areas on the substrate. A compact, easy to mount single element Petzval sum corrector may be formed this way.

The object side surface and the image side surface may be convex, thus allowing to build a mirror group having convex mirrors only. It is also possible to use a transparent substrate formed like a plano-convex lens having one planar and one convex surface such that the mirror group includes at least one planar reflecting area orthogonal to the optical axis.

Optical imaging systems according to the invention are designed such that at least one intermediate image is formed between the object surface and the image surface. As a consequence, at least two pupil surfaces are formed between the object surface and the image surface. There are different ways to arrange the mirror group within the optical system with regard to field surfaces and pupil surfaces. In one embodiment a front pupil surface of the imaging system is disposed in the geometrical vicinity of the mirror group entry and a rear pupil surface is disposed in the geometrical vicinity of the mirror group exit. As a consequence, at least one intermediate image is disposed optically within the mirror group.

The terms "front" and "rear" relate to the position along the optical path, wherein a front pupil surface lies upstream of a rear pupil surface. Geometrically, a front pupil surface will normally be closer to the object surface, whereas a rear pupil surface will normally be closer to the image surface. Relatively large object side and image side working distances of the mirror group can be obtained this way.

A mirror group entry or exit arranged geometrically close to a pupil surface may be arranged axially nearer to a pupil surface than to a field surface (where an intermediate image may be positioned). Preferred axial positions geometrically close to a pupil surface may be characterized by the fact that the height of a chief ray is smaller than the height of a marginal ray of the imaging process at the respective axial position. The marginal ray is a ray running from an inner field point (closest to the optical axis) to the edge of an aperture stop, whereas the chief ray in a ray running from an outermost field point (farthest away from the optical axis) and intersecting the optical axis at a pupil surface position.

In embodiments having a pupil surface of the imaging system geometrically close to the mirror group entry a Fourier lens group is preferably arranged between the object surface and the mirror group entry allowing to transform the spatial distribution of radiation at the object surface into an angular distribution of radiation at the mirror group exit. Likewise, a Fourier lens group may be arranged between the mirror group exit and the image surface. The Fourier lens group upstream of the mirror group entry allows to adjust the angles of incidence with which the radiation enters the mirror group and impinges on the first mirror. The Fourier lens group downstream of the mirror group may be designed to form a desired correction status of the radiation in the image surface. Object side and/or image side telecentricity can be obtained.

The term "Fourier lens group" as used here refers to a single optical element or to a group consisting of at least two optical elements which perform one single Fourier transformation or an odd number of consecutive Fourier transformations between a front focal plane and a rear focal plane of the Fourier lens group. A Fourier lens group may be all refractive consisting of one or more transparent lenses. A Fourier lens group may also be purely reflective consisting of one or more mirrors, at least some of the mirrors being curved mirrors. Catadioptric Fourier lens groups combining transparent lenses and mirrors are also possible. In preferred embodiments of the invention a Fourier lens group is purely refractive.

In another embodiment, a front field surface of the imaging system is positioned in the vicinity of the mirror group entry and a rear field surface of the imaging system is disposed in the geometrical vicinity of the mirror group exit. Embodiments of this type have at least one pupil surface of the imaging system disposed optically between mirror group entry and mirror group exit, i.e. within the mirror group. The pupil surface may be disposed geometrically within an inter-mirror space defined by the mirrors of the mirror group. Embodiments of this type allow to place the mirror group close to the object surface or the imaging system, should that be desired. Here, the object surface may be optically close to the mirror group entry. In other embodiments, a front relay imaging system may be arranged between the object surface and the mirror group such that an image surface of the front relay system essentially coincides with the mirror group entry.

Generally, the optical imaging system may be directly used to image an object disposed in the object surface onto an image disposed in the image surface. However, it is also possible to use the optical imaging system as a partial system of a larger optical system, such as a catadioptric projection objective useful for lithography. In some embodiments, a first relay imaging system is arranged between the object surface and the mirror group. The front relay system may have a magnification $\beta$ in the range of $0.8 \leq |\beta| \leq 1.2$, i.e. it may have small magnification or demagnification or may be a 1:1 system primarily provided to form a field surface geometrically apart from the object surface of the entire system.

It is also possible to provide a rear imaging system arranged between the mirror group and the image surface of the optical system. The rear imaging system may be designed as a demagnifying system having a high NA image side.

The imaging system including the mirror group may be used as a relay system linking field surfaces of a larger system together. Preferably, a magnification $\beta$ of the imaging system lies in a range $0.8 \leq |\beta| \leq 1.2$ such that the size of the image created by the imaging system is close to the size of the object. In these embodiments, the primary effect of the imaging system may be to provide a significant overcorrection of the Petzval sum, which may serve to compensate some or almost all opposite effects on image curvature caused by the other optical elements outside the mirror group.

In some embodiments all reflecting areas are non-symmetrical with respect to the optical axis.

In some embodiments all reflecting areas are outside the optical axis (off-axis footprint).

Preferably, the imaging system has no planar folding mirrors inclined to the optical axis non-orthogonally.

In preferred embodiments, the mirror group has no convex mirror. Since a convex mirror has an opposite effect on an image curvature when compared to a concave mirror, convex mirrors should be avoided if the mirror group is optimized for overcorrecting the Petzval sum.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIGS. 11 and 12 show variants of the imaging system of FIG. 10;

FIG. 20 shows an embodiment of an imaging system having four mirrors providing six reflections, where three intermediate images are formed within the mirror group;

FIG. 21 shows an embodiment of an imaging system having a mirror group with two truncated lenses within the mirror group;

FIG. 22 shows an embodiment of an imaging system having one positive lens within the mirror group providing refractive power close to image and pupil surfaces;

Figure 1:
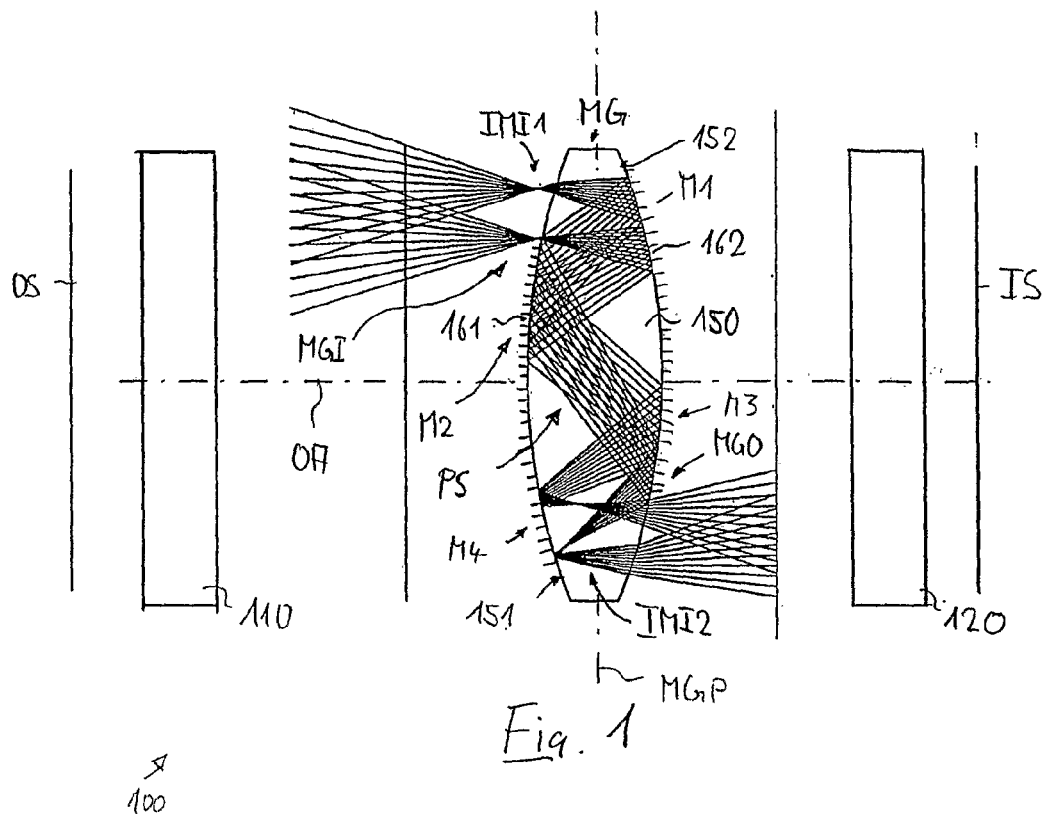
FIG. 1 shows an embodiment of an imaging system having a mirror group with four concave mirrors formed on a single, trans-parent substrate.

In the following description of preferred embodiments of the invention, the term "optical axis" shall refer to a straight line or sequence of straight-line segments passing through the centers of curvature of the optical elements involved. The optical axis is folded by folding mirrors (deflecting mirrors) or other reflective surfaces. In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

In the following description embodiments having a plurality of mirrors are described. Unless stated otherwise, the mirrors will be numbered according to the sequence in which the radiation is reflected on the mirrors. With other words, the numbering of the mirrors denotes the mirrors according to the position along the optical path of radiation, rather than according to geometrical position.

Where appropriate, identical or similar features or feature groups in different embodiments are denoted by similar reference identifications. Where reference numerals are used, those are increased by 100 or multiples of 100 between embodiments.

In all embodiments given below the surfaces of curvature of all curved mirrors have a common axis of rotational symmetry, also denoted mirror group axis. The mirror group axis coincides with the optical axis OA of the imaging system. Axially symmetric optical systems, also named coaxial systems, are provided this way. The object field an image field are off-axis, i.e. positioned at a radial distance from the optical axis. All systems have a circular pupil centered around the optical axis thus allowing use in projection objectives for microlithography or as projection objectives for microlithography. Where planar mirrors are provided, the surface normal perpendicular to the mirror surface lies parallel to the optical axis of the system.

FIG. 1 shows a partly schematic representation of an embodiment of a catadioptric imaging system 100. It is designed to project an image of a pattern on a reticle arranged in the object surface OS into the image surface IS on a reduced scale, for example 4:1, while creating exactly two real intermediate images IMI1, IMI2. The first refractive objective part 110 serving as a refractive relay on the reticle end of the system is designed for imaging the pattern from the object surface into the first intermediate image IMI1. A second objective part consists of a mirror group MG and serves to image the first intermediate image IMI1 into the second intermediate image IMI2. A third refractive objective part 130 is designed as a refractive focusing group for imaging the second intermediate image IMI2 into the image surface IS with a strong reduction ratio, e.g. 4:1. When the imaging system 100 is used as a catadioptric projection lens in a microlithographic projection exposure apparatus, the object surface OS and the image surface IS are essentially plane surfaces, also denoted object plane and image plane.

The mirror group MG is an imaging subsystem arranged between the refractive relay 110 on the reticle end of the system and the refractive focusing group 130 on the image end of the system. Between the two refractive groups 110, 130 there is an intermediate image IMI1, and that is where the mirror group MG is placed. The primary purpose of the mirror group MG is to correct the Petzval sum of the lens groups 110, 130 using mainly reflective power. This particular embodiment of a mirror group MG in the middle of the complete system forms another image (intermediate image IMI2) of the intermediate image IMI1 and is close to being a unit magnification relay.

The mirror group MG is formed by a single optical element. A trans-parent substrate 150 shaped like a symmetric, biconvex lens and made of fused silica or a crystalline fluoride material, such as calcium fluoride, has a convex object side surface 151 and a convex image side surface 152, both surfaces being spherical and having the same radius of curvature. Reflecting coatings 161, 162 are deposited on the surfaces over the central part of the surfaces, leaving a clear outer part close to the first intermediate image IMI1 on the object side (providing a mirror group entry MGI) and close behind the second intermediate image on the image side (providing a mirror group exit MGO).

Radiation coming from the first intermediate image IMI1 enters without vignetting through the mirror group entry MGI and undergoes four reflections on concave mirror surfaces between the first intermediate image IMI1 and the second intermediate image IMI2 prior to exiting at the mirror group exit MGO. A first mirror M1 having an object side mirror surface reflects radiation to second mirror M2 having an image side reflecting surface. Second mirror M2 reflects radiation to the third mirror M3 having an object side reflecting surface, from which radiation is reflected to forth mirror M4 having an image side reflecting surface and reflecting radiation to the second intermediate image close to the fourth reflecting surface. After that, radiation exits the transparent substrate without vignetting by the reflecting coating 162 on the substrate image side surface. It is apparent from FIG. 1 that the reflecting areas (also denoted footprints) of the beam do not overlap on mirrors M1 and M3 or on mirrors M2 and M4.

The mirrors of the mirror group define a mirror group plane MGP alined perpenticular to the optical axis OA and arranged geometrically between mirror group entry MGE and mirror group exit MGO. Specifically, the mirror group plane in this embodiment is positioned half-way between the vertex positions of the first mirror M1 (geometrically closer to the image surface) and M2 (geometrically closer to the object surface). Radiation coming from the mirror group entry MGE passes five times through that mirror group plane before exiting through the mirror group exit MGO. This indicates that four reflections on concave surfaces occur in an axially compact region defined by the mirror surfaces. In this embodiment the length ratio (LR) between the mirror group length (MGL, axial distance between most object side and most image side mirror vertices of the mirror group) and the total track length (TT, axial distance between object surface and image surface) is about 20%. Compensation of the image curvature effected by the positive refractive powers of relay systems 110 and 120 can thereby be compensated with the compact mirror group MG.

When compared to systems having only two reflections on concave mirrors the four reflection approach allows the mirror curvatures to be not as strong as in two reflection designs and the mirror sags can be considererably smaller for obtaining the same overcorrecting effect on Petzval sum. This may be a beneficial factor in the practicality of making the mirror surfaces, particularly if they are aspheric.

Note that the mirrors M1, M2, M3, M4 may also be designed as front face mirrors, whereby mirrors M1 and M3 may be formed on a common mirror substrate and mirrors M2 and M4 may also be formed on a common mirror substrate.

Optically, the mirror group MG forms a unit magnification relay system providing a lot of Petzval curvature, which can be adjusted to be just the right amount to correct for the adverse effects on Petzval curvature of the refractive systems 110, 130 upstream or downstream of the mirror group. Reflections occur close to field surfaces at M1 and M4 and in the vicinity of a pupil surface PS at M2 and M3. Both field and pupil aberrations may therefore be positively influenced. With spherical surfaces, the mirror group MG will introduce pupil aberration. Making the mirror surfaces aspherical can correct for such pupil aberrations.

The mirror group MG is shown with an input side numerical aperture $NA_f=0.3$ and is telecentric on the entrance side. The output to the image side end is $NA_o=0.3$ but is not telecentric. The single element forming the mirror group MG could be placed in the middle region of a catadioptric projection objective having a reduction ratio of 4:1 and an image side numerical aperture NA=1.2 when used with an immersion fluid having high refractive index (e.g. $n_f \geq 1.3$).

The simple construction of the element imposes some restrictions on the optical performance. It is rather difficult to get low etendu (geometric light guidance value, product of image side field size and numerical aperture) with this element. The field radius should be fairly large in order to have the element not see any vignetting. The element is preferably suited for use with a ring field.

It is worth to note that the outer parts of the field see total internal reflection on the second and third reflections. Therefore, the reflective coatings at the outer edge (away from the optical axis OA) of the second mirror M2 and the third mirror M3 do not have to cover as much of the central parts of the object side and image side surfaces as would normally be the case. Therefore, the unvignetted field can be made a little larger.

The element forming the mirror group MG is relatively small and extremely simple in design and can be made to be very effective in providing just the right amount of Petzval sum correction that is wanted in a specific mounting situation. The element MG forming the mirror group may be used as a "Petzval sum corrector" in catadioptric projection objectives for microlithography, but can also be useful in other fields of applications, such as in endoscopes, periscopes or other optical imaging systems with extended installation space filled with lens elements having positive power.

The transparent optical material passed by the radiation between the reflections makes the beam diameter on the reflecting areas smaller than it would be if there was only air or another gas between the mirrors of the mirror group. That helps to avoid vignetting. Although the two intermediate images are close to the convex surfaces of the substrate it is preferred to provide a small distance between an intermediate image and the nearest optical surface in order to avoid imaging surface faults on the image plane and in order to avoid problems due to heating of the optical material by the radiation concentrated in the intermediate image region.

Figure 2:
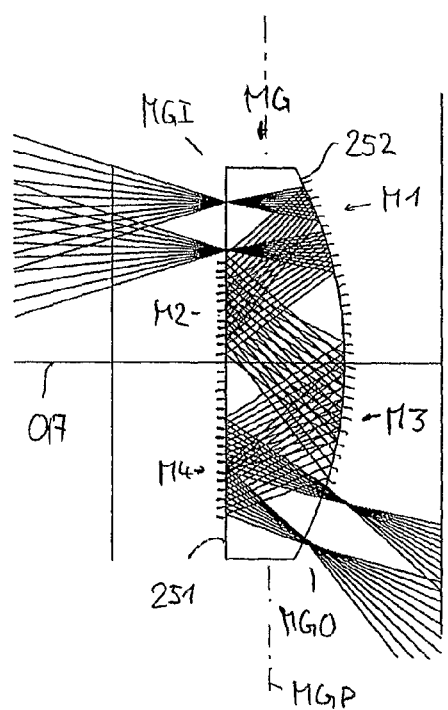
FIG. 2 shows a variant of the mirror group of FIG. 1.

It is evident from the embodiment 200 shown in FIG. 2 that the object and image side surfaces of the mirror group MG do not have to have the same radius. In FIG. 2 it is shown what happens if the image side surface 251 is made flat (and perpendicular to the optical axis OA), whereas the object side surface 252 is convex.

The resulting mirror group MG has two concave mirrors M1 and M3 and two planar mirrors M2 and M4, thus providing four reflections, but only two reflections on concave mirror surfaces. The mirror group plane MGP is transited five times. When compared to other designs having two reflections on concave mirrors this embodiment may be preferable from a manufacturing point of view since both concave mirrors M1 and M3 share a common surface of curvature which can be manufactured in one step.

Optically, the mirror group MG of FIG. 2 has a magnification 1.4:1 and the output is very far from telecentric whereas the input is telecentric. There is less Petzval correction provided than in the embodiment shown in FIG. 1, however the unvignetted field can be a little wider than in that embodiment.

If the transparent material is removed between the four mirrors, then it is easily possible to make each of the four mirrors have a different radius of the reflecting surface. This allows a lot more possibilities to control the magnification, telecentricity, and unvignetted field size of the sub-system formed by the mirror groups.

It is interesting to note that the principle explained by the examples of FIGS. 1 and 2 can easily be modified to provide further embodiments. For example, the image side surface of the transparent substrate must not be coated with a reflective coating between the reflective area of the first mirror M1 and the third mirror M3. The beam folding can be effected such that radiation exits the mirror group between the first mirror M1 and the third mirror M3, near the middle of the image side substrate surface. In this embodiment, radiation leaves the element above the third reflection, instead of below as shown in the examples.

Figure 3:
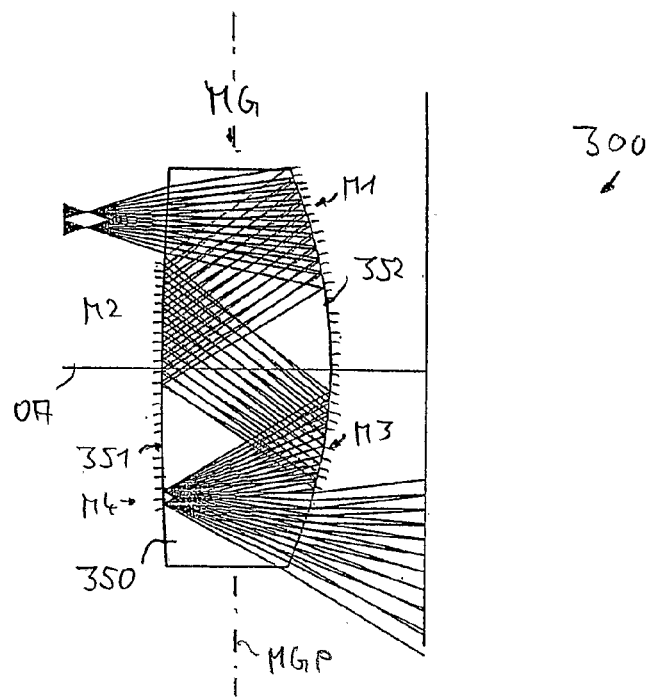
FIG. 3 shows another variant of the mirror group in FIG. 1.

The embodiment 300 shown in FIG. 3 follows essentially the same design principles as those in FIGS. 1 and 2. Here, the transparent substrate 350 has a convex object side surface 351 and image side surface 351, however the curvatures are different. Therefore, the design provides four concave mirrors, wherein mirrors M1 and M3 have identical curvature and mirrors M2 and M4 have smaller, but also identical curvature. The mirror group plane is passed five times. The mirror group MG could be followed by a positive lens to bend the rays towards the optical axis OA.

Figure 4:
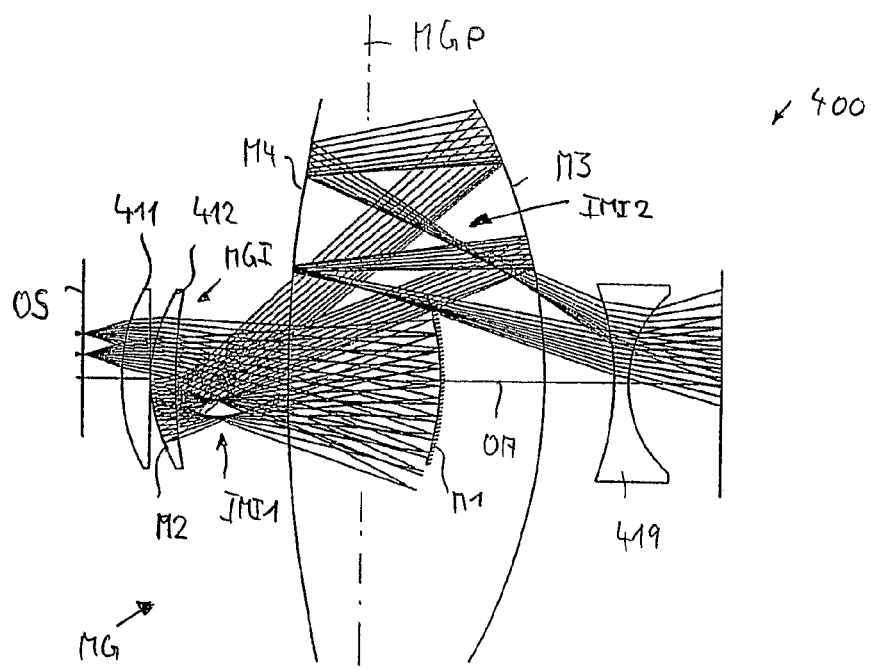
FIG. 4 shows an imaging system having four concave mirrors and forming two intermediate images.

In FIG. 4 an object side part of a catadioptric projection objective 400 according to another embodiment is shown, providing a mirror group MG with four consecutive reflections on concave mirrors. This objective part is characterized by very little use of transparent optical material and a strong overcorrection of Petzval sum. The partial system shown in FIG. 4 could be followed by a focusing lens group which has almost all positive power and corresponding Petzval undercorrection.

The mirror group MG includes a first mirror M1 arranged on the optical axis OA, but used eccentrically thereto, having an object side concave mirror surface, and a second mirror M2 arranged close to the optical axis, but outside the optical axis. The mirror group plane MGP lies between M1 and M2. The second mirror M2 is formed by a reflective coating on a convex object side surface of a meniscus shaped positive lens 412. A third concave mirror M3 having an objective side mirror surface is placed outside the optical axis at a distance therefrom on the opposite side of mirror M2 and faces a fourth concave mirror M4 arranged on the same side of the optical axis at a distance thereto. The radiation coming from the object surface OS is converged by two consecutive positive lenses 411, 412 prior to entering the mirror group at mirror group entry MGI. The positive lens 412 is built by the transparent substrate of second mirror M2. The first intermediate image IMI1 is formed after reflection on mirror M1 and prior to reflection on mirror M2 at a distance ahead of Mirror M2. The concave secondary mirror M2 sends the reflected light beam across the optical axis OA towards the third concave mirror M3, which converges the beam towards fourth mirror M4, which reflects a convergent radiation beam towards by concave negative lens 419 geometrically behind the mirror group MG. A second intermediate image IMI2 is formed behind M4 within the mirror group. The mirror group plane is transited five times by the radiation. When compared to the embodiments given above this embodiment has an advantage that the incidence angles on the mirrors M1 to M4 are not as steep as in the prior embodiments, and the mirror sags are smaller. Here, a mirror sag is defined as the axial separation of a plane normal to the optical axis and touching the edge of the concave mirror to a plane parallel thereto and touching the vertex of the concave mirror. The sag is dependent on the curvature radius R of a mirror surface, and the diameter D of the mirror. In a first approximation the sag SAG is given by: $SAG = R - (R^2 - D^2/4)^{0.5}$.

Figure 5:
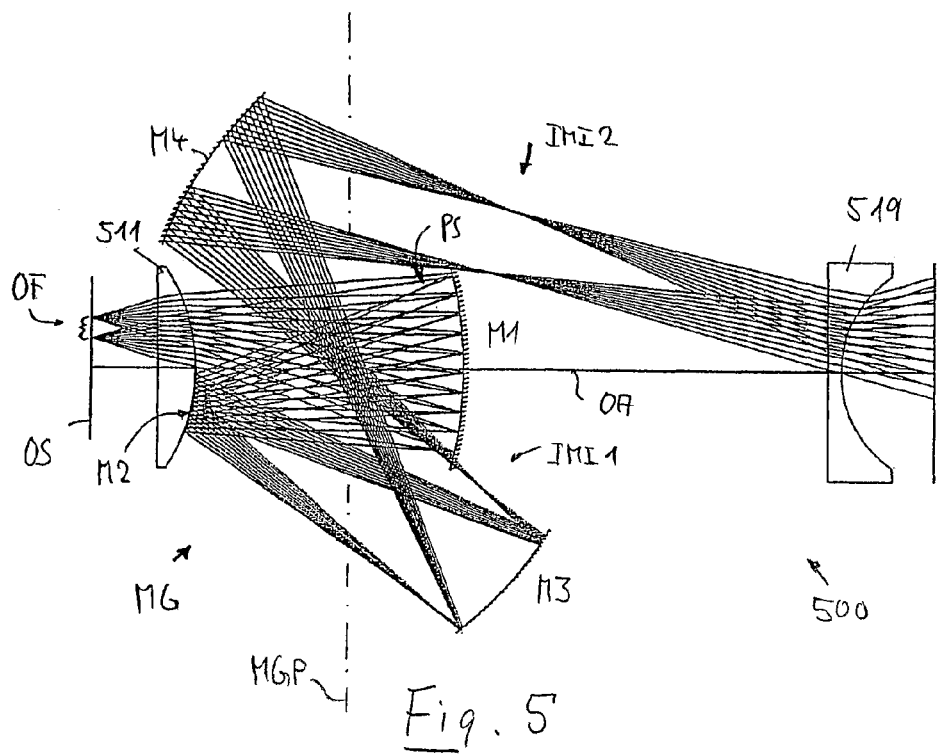
FIG. 5 shows a variant of the embodiment of FIG. 4, where the mirror group includes one convex mirror.

In FIG. 5 another front end section of a catadioptric projection objective 500 is shown including a mirror group MG having four mirrors M1 to M4 designed primarily as a Petzval sum corrector. Like in the embodiment shown in FIG. 4 little lens mass is used in this front part. Radiation coming from the object surface OS is converged by a positive lens 511 prior to impinging on the first mirror M1 positioned on the optical axis. The second mirror M2 of the mirror group is a convex mirror formed by a coating on the convex exit side of the positive lens 511 on the opposite side of the off-axis object field OF. Radiation diverged by convex mirror M2 forms a first intermediate image IMI1 and hits concave mirror M3 arranged such that radiation reflected therefrom crosses the optical axis OA to hit concave mirror M4 placed on the opposite side of the optical axis. Radiation reflected from concave mirror M4 forms an intermediate image IMI2 at a distance ahead of a plano-concave negative lens 519 for bending the radiation along the optical axis. In a modification, a negative lens is placed in front of the first mirror, which is at a pupil surface PS of the optical system, to provide color correction. The negative lens 519 optically behind the mirror group is designed such that the entire subsystem including the mirror group MG is telecentric on both ends and the net Petzval sum of the subsystem is just about what is needed to correct for the opposite effect on image curvature provided by a focusing group downstream of negative lens 519. The numerical aperture at the object surface OS is $NA_O = 0.3$.

As opposed to the embodiments given above, the mirror group includes one convex mirror (second mirror M2). The concave mirror counteracts the desired effect of the mirror group on Petzval sum correction, however provides additional degrees of freedom to control number and position of intermediate images or a desired beam path geometry.

Figure 6:
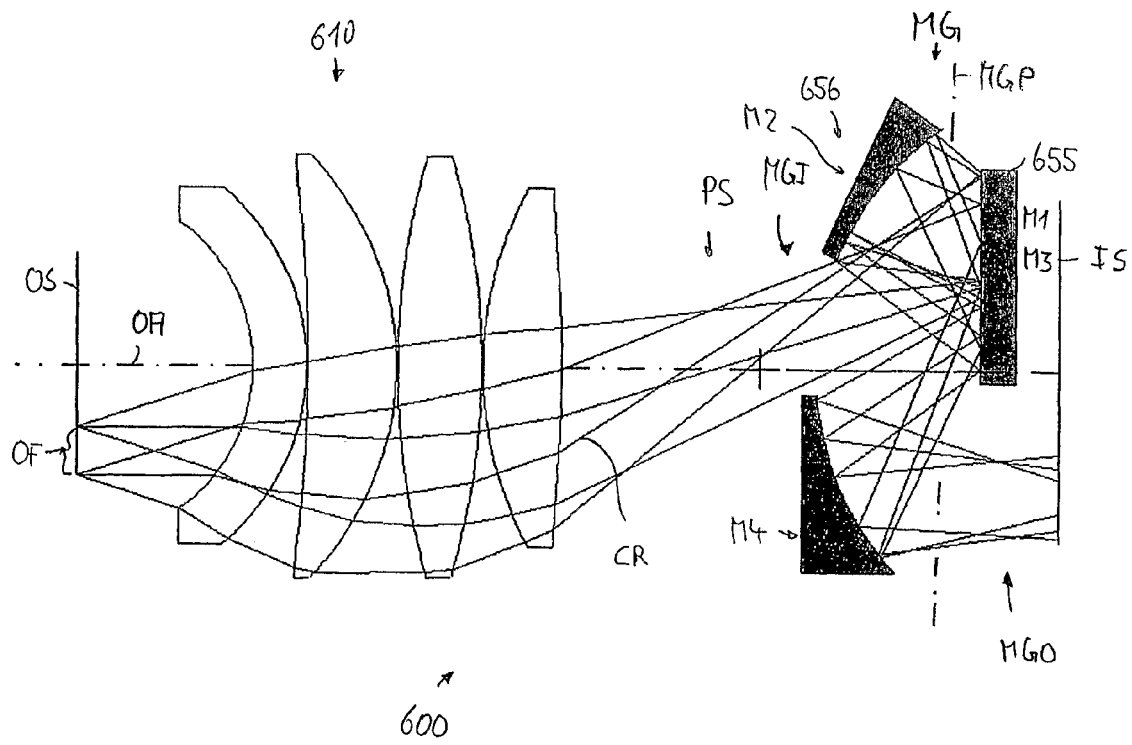
FIG. 6 shows an embodiment having a mirror group with one multiple reflecting plane mirror.

In FIG. 6 an embodiment of a catadioptric imaging system 600 is shown which serves to image an off-axis object field OF in the plane object surface OS into an image surface IS. The axial section shown in FIG. 6 includes a refractive group 610 comprising four consecutive lenses providing positive power and a mirror group MG following thereon. The positive lens group 610 converges the beam such that a pupil surface PS is created between the lens group 610 and the mirror group MG where the chief ray CR of the imaging process crosses the optical axis OA. The purely reflective mirror group MG has an image side mirror substrate 655 having an object side, plane mirror surface and an object side concave mirror 656 having an image side concave mirror surface. A hole in the object side mirror substrate 656 disposed eccentrically to the optical axis and including the optical axis forms the mirror group entry MGI where radiation enters the intermirror space defined between mirrors 655, 656.

Radiation entering the mirror group at the mirror entry MGI obliquely to the optical axis is incident on a first, planar mirror M1 and reflected to the upper part of mirror substrate 656 which forms the concave mirror M2. Radiation reflected from M2 strikes planar mirror M3 which is formed by the mirror substrate 655 and is reflected to the concave fourth mirror M4 formed by the lower part of the mirror substrate 656 prior to leaving the mirror group at the mirror group exit MGO. Two intermediate images are formed within the mirror group. The mirror group plane MGP is passed five times.

Both mirrors 655, 656 are used twice such that four reflections occur within the mirror group. On the concave mirror 656 forming the second and fourth mirrors M2 and M4 the radiation strikes the broken mirror surface at non-overlapping reflecting areas disposed on either side of the optical axis and spaced apart therefrom. On the other hand, the plane mirror 655 is used as a "multiply reflecting mirror" where the footprints of radiation, e.g. the reflecting areas of the first reflection (at mirror M1) and of the third reflection (at mirror M3) overlap considerably such that most surface elements of the mirror 655 are used twice at two consecutive reflections by the radiation beam passing through the mirror group. Using the mirror elements for more than one reflection allows to reduce the number of optical elements of the mirror group and helps to reduce mass and costs.

The embodiment of a mirror group in FIG. 6 is similar to the embodiment of the mirror group in FIG. 2 insofar as planar mirrors are used in conjunction with concave mirrors. However, providing a mirror group entry on the optical axis (eccentric thereto) and reflections on either side of the mirror group entry without vignetting has certain advantages. Particularly, the inner field of radiation can be positioned closer to the optical axis at larger apertures of the radiation. Further, no color correction problems are generated due to the absence of transparent optical material in the purely reflective mirror group.

Figure 7:
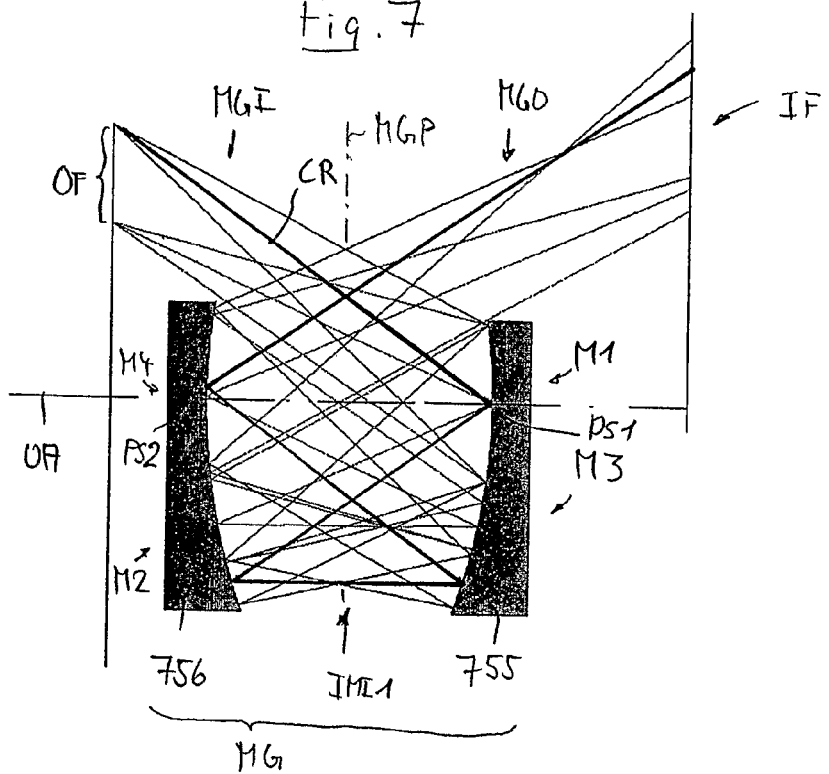
FIG. 7 shows an embodiment of an imaging system having a mirror group with two concave mirrors each used as a multiple reflecting mirror with reflections close to pupil surfaces and close to field surfaces.
Figure 8:
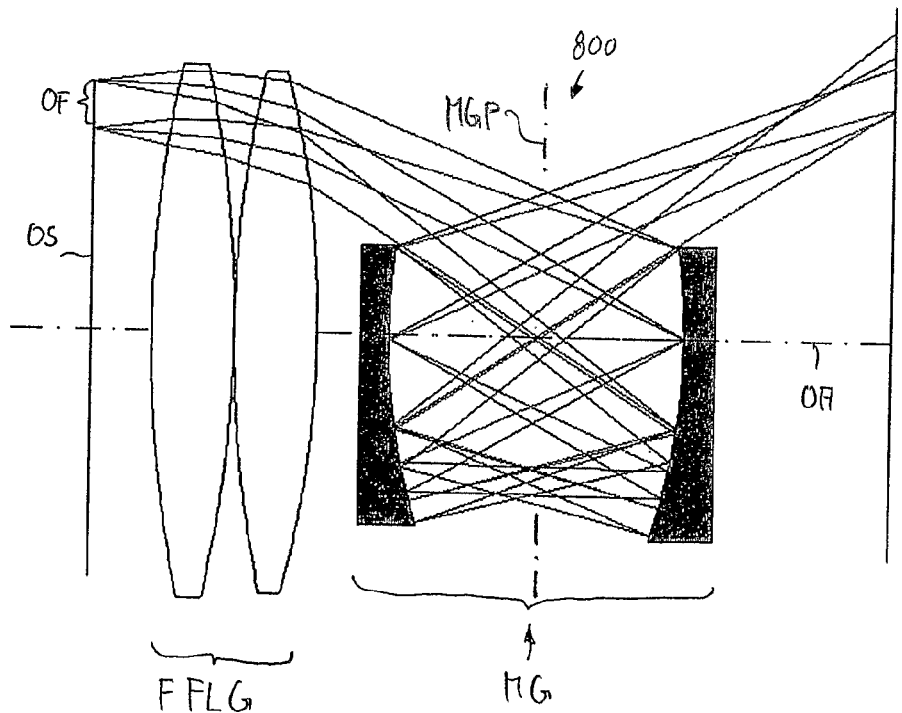
FIG. 8 shows a variant of the imaging system of FIG. 7 having object-side telecentricity.

In FIG. 7 an embodiment of a mirror group MG is shown which can be incorporated in different ways into catadioptric imaging systems (compare FIGS. 8 and 12). The purely reflective mirror group MG consists of an object side concave mirror 756 having a concave mirror surface facing the image side (on the right hand side of FIG. 7) and an image side concave mirror 755 having a concave mirror surface facing the object side such that the two mirror surfaces define the axial ends of an intermirror space positioned between the surfaces of curvature of the two mirrors. The mirrors 755, 756 share a common mirror axis (symmetry axis of concave mirror surfaces) which coincides with the optical axis OA of the entire system. The mirrors 755, 756 are arranged eccentrically to the optical axis. The mirror group entry MGI is positioned next to the edge of the object side mirror 756 facing to the side where the off-axis radiation from the object field OF enters the mirror group. The mirror group exit MGO is positioned on the same side of the optical axis OA next to the upper edge of the image side mirror 755. The position of the mirror group with respect to the radiation provided from a part of the optical system upstream of the mirror group (left hand side of FIG. 7) and the mirror curvatures are adjusted such that the radiation is reflected twice on the image side mirror 755 and twice on the object side mirror 756 prior to exiting the mirror group at the mirror group exit MGO. The path of the chief ray CR of an outer field point of the off-axis object field OF is drawn bold in FIG. 7 in order to facilitate following the beam path.

The beam entering the mirror group is first reflected on a first mirror M1 at a reflecting area basically centered around the optical axis OA. The reflected radiation is incident on a second mirror M2 on the object side mirror 756 in a reflecting area which is spaced apart from the optical axis. The radiation reflected from the second mirror is incident on a third mirror M3 formed by the image side mirror 755 in a reflecting area spaced apart from the optical axis and partially overlapping with the reflecting area of the first mirror M1. Radiation reflected from the third mirror M3 is incident on the fourth mirror M4 formed by a surface area of the object side mirror 756 in a reflecting area essentially centered around the optical axis OA, from where it is reflected to the mirror group exit MGO. The mirror group plane MGP situated halfway between the mirrors is transited five times by the radiation between mirror group entry and exit. It is evident that both concave mirrors 755, 756 are used as multiply reflecting mirrors such that the mirror group provides four consecutive reflections at concave mirror surfaces, which provides a strong overcorrection of Petzval sum.

The image side and object side mirrors 755, 756 may be designed and arranged mirror-symmetrically with respect to a symmetry plane (mirror group plane MGP) positioned midways between the mirrors orthogonal to the optical axis OA. However, to mirrors may have different curvatures of the concave mirror surfaces. Although both mirror surfaces are spherical in the embodiment, one or both mirror surfaces may be aspheric.

It is evident from FIG. 7 that the first reflection (at mirror M1) occurs at a first pupil surface PS1 where the chief ray CR crosses the optical axis OA. The two following reflections (at mirrors M2 and M3) are close to a field surface formed by the first intermediate image IMI1 arranged between the mirrors 755, 756 at a distance from both concave mirror surfaces. The fourth reflection at mirror M4 is close to second pupil surface PS2. Since both reflections close to field surfaces and to pupil surfaces are provided, correction of both pupil aberrations and field aberrations are possible, such allowing improved optical performance.

The absolute value of magnification β is close to 1, and the object field OF and image field IF are positioned on the same side on the optical axis. Since four reflections on concave mirrors are provided, a strong Petzval overcorrection can be obtained with relatively small mirror sags, which are preferable from a manufacturing point of view, particularly if a mirror surface is aspheric.

In an alternative embodiment, the mirrors M1 and M3 on the image side and M4 and M2 on the object side may be formed by reflective coatings on an transparent substrate to provide a single element Petzval corrector (compare e.g. FIG. 1).

Figure 9:
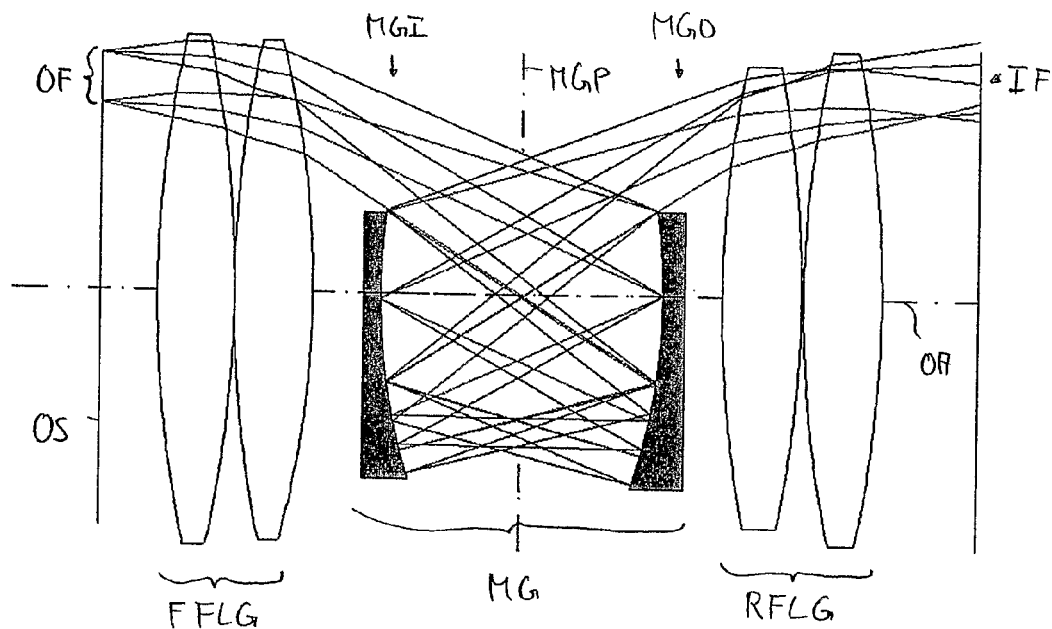
FIG. 9 shows a variant of the imaging system of FIG. 8 having object side and image side telecentricity.

A mirror group having two multiply reflecting mirrors similar to that shown in FIG. 7 can be used in various combinations with other optical elements. For example, object side telecentricity can be obtained if a front Fourier lens group FFLG having positive refractive power is provided between the object surface OS and mirror group (FIG. 8) to obtain system 800. Likewise, image side telecentricity can be obtained if a rear Fourier lens group RFLG is provided between the mirror group exit MGO and the image surface (FIG. 9). FIG. 9 shows a catadioptric imaging system 900 being telecentric on both ends and providing strong Petzval overcorrection. Here, the condition 30%<LR=MGL/TT<40% holds for the length ratio LR between mirror group length MGL and total track length TT.

Figure 10:
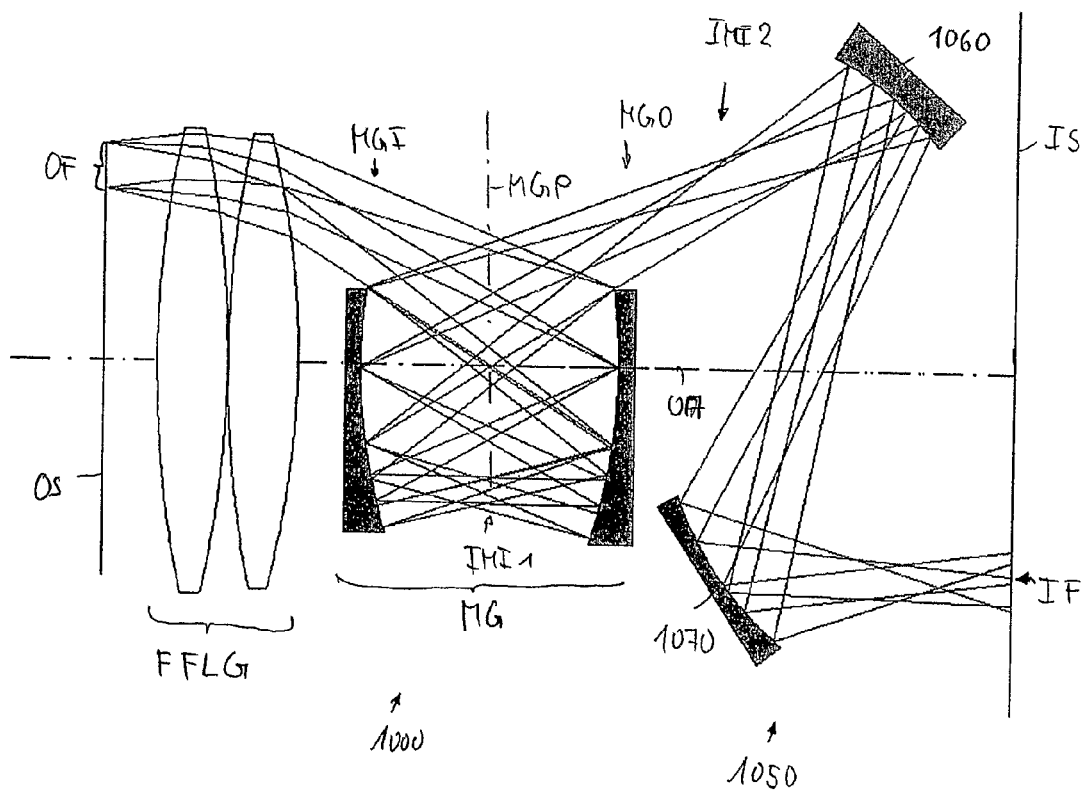
FIG. 10 shows a variant of the imaging system of FIG. 8 where a catoptric imaging system follows the mirror group.

The catadioptric imaging system 1000 of FIG. 10 is derived from the object side telecentric system 800 of FIG. 8 by adding a purely reflective (catoptric) imaging system 1050 between the mirror group exit MGO of the mirror group MG and the image surface IS. In this embodiment, the field surface immediately following the mirror group forms a second intermediate image IMI2 of the optical system, which is imaged by the catoptric system 1050 onto the image surface. The catoptric imaging system 1050 consists of an image side concave mirror 1060 arranged on the side of the mirror group exit for receiving radiation from the mirror group exit, and an object side concave mirror 1070 arranged on the opposite side of the optical axis to receive radiation reflected from the concave mirror 1060 and reflect the radiation to the image surface. The surfaces of curvature of concave mirrors 1060, 1070 are coaxial to the optical axis. When compared to the action of the image side rear Fourier lens group RFLG of FIG. 9, the catoptric imaging system 1050 of FIG. 10 has a similar effect in providing image side telecentricity. In contrast to this system, two further reflections close to field surfaces of the radiation adding to Petzval overcorrection are provided, and the off-axis image field IF is now positioned on the opposite side of the object field OF.

In FIG. 11, another variant of an optical imaging system 1100 is shown having a catoptric imaging system 1150 optically downstream of the mirror group MG. A first concave mirror 1160 receives radiation from the mirror group exit MGO and reflects the radiation to a second concave mirror 1170 having an image side concave mirror surface reflecting the radiation to the image surface. The surface curvature of both mirrors 1160, 1170 are concentric to the optical axis, however, as opposed to the embodiment shown in FIG. 10, one off-axis concave mirror 1170 is arranged besides the mirror group MG in the axial space defined by the mirror group, whereby an axially compact design can be obtained. When compared to the embodiment of FIG. 10, it is evident and that the incidence angles on mirrors 1160, 1170 of the catoptric group 1150 are substantially smaller than in that embodiment, allowing relatively flat concave mirrors which are easier to manufacture, particular when aspheric mirror surfaces are provided. These advantages can be obtained if the catoptric mirror group 1150 is arranged such that entrance radiation coming from the mirror group exit MGO crosses the radiation exiting the catoptric group (crossed beam paths).

In the embodiment of a catadioptric imaging system 1200 in FIG. 12 a catoptric system 1250 following the mirror group MG is provided, wherein the first mirror 1260 of that catoptric group is a concave mirror, and a second mirror 1270 for receiving radiation reflected from the first mirror is a convex mirror. Whereas the concave mirror 1260 is arranged close to a field plane provided by a second intermediate image IMI2, the concave mirror is arranged closer to the optical axis and closer to a pupil surface. The convex mirror 1270 is very effective to correct spherical aberration of the pupil. In this system, the mirror group MG serves the primary purpose of providing overcorrection of the Petzval sum. The catoptric group 1200 downstream of the mirror group provides further aberration correction and provides a chief ray CR which is approximately directed in the right direction with respect to a position of an aperture stop in a refractive focusing group arranged downstream of the system shown in FIG. 12.

Figure 13:
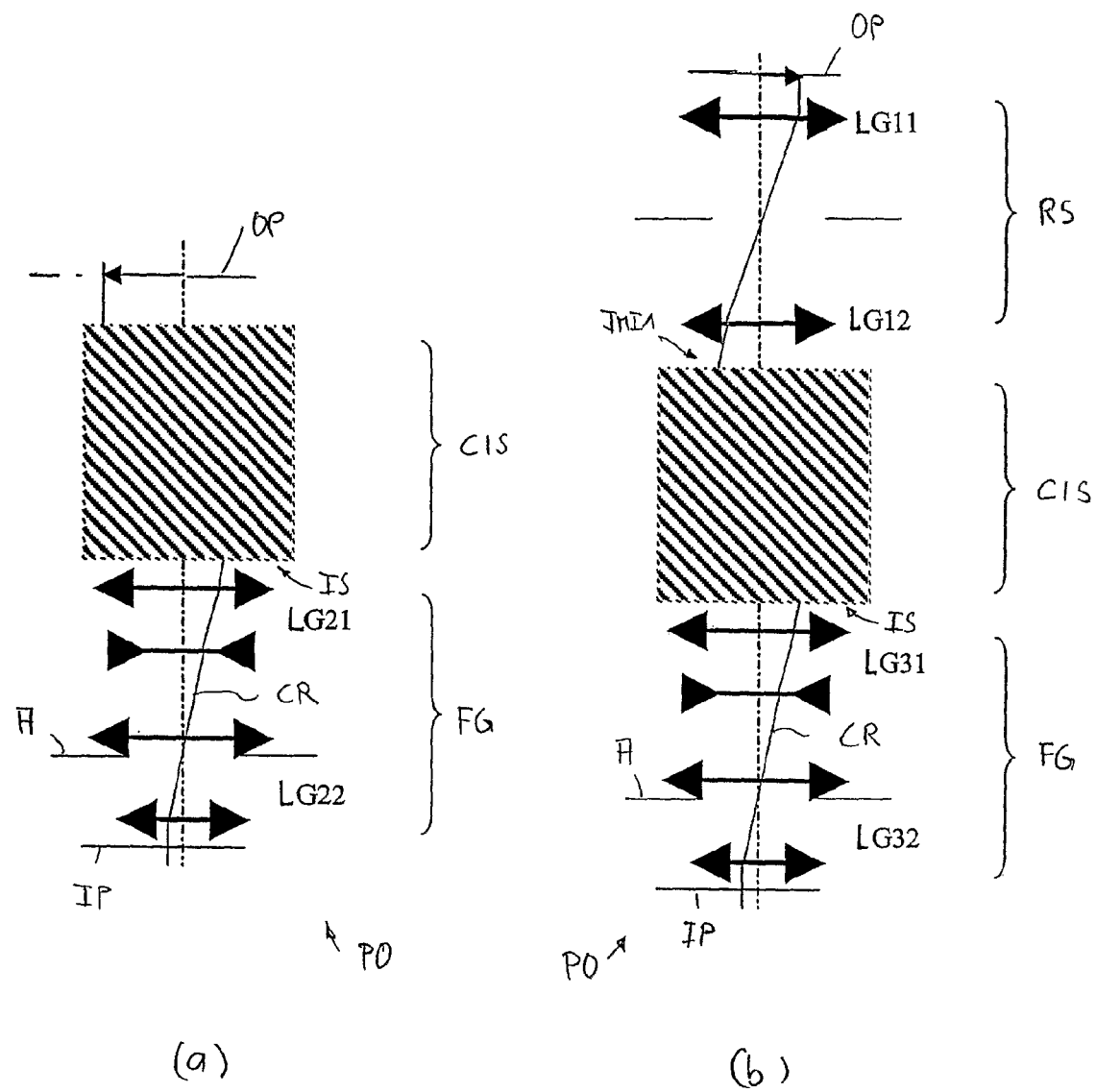
FIG. 13 shows different embodiments of catadioptric projection objectives including imaging systems with mirror groups for Petzval sum correction.

The systems described above can be used in various fields of application, particularly where imaging with a flat image field is desired or necessary. For example, the systems described above may be incorporated into catadioptric projection objectives for microlithography to provide the major part or all of the means for correcting the Petzval sum. In FIG. 13, two out of various ways to incorporate a Petzval sum corrector into catadioptric projection objective are shown. In each figure, the catadioptric imaging system CIS providing the Petzval sum correction is symbolized by a hatched rectangle.

Embodiments according to FIG. 13(*a*) are characterized by the fact that the object plane OP of the projection objective PO coincides with the object surface of the catadioptric imaging system CIS. This is where a mask (reticle) is to be placed. An image of the mask pattern created by the imaging system CIS appears in the image surface IS of the catadioptric imaging system. This image surface is the object surface of a refractive focusing group FG adapted to refocus the intermediate image positioned at IS into the image plane IP of the projection objective PO, where a wafer or another substrate coated with a photosensitive layer is positioned. Whereas the catadioptric imaging system CIS provides close to unit magnification such that the intermediate image at IS has about the size of the object, the focusing group provides the major part of the overall reduction ratio, which may be 4:1 or 5:1 or below.

The focusing group FG consists of a first lens group LG21 and a second lens group LG22, an aperture stop A being positioned between the first and second lens groups where the chief ray CR crosses the optical axis OA. A first lens group LG21 includes positive refractive power (symbolized by double arrows with arrow heads facing outwardly) on the entrance side, followed by negative refractive power (symbolized by double arrows with arrow heads facing inside), followed by positive refractive power immediately prior to the aperture stop. Positive refractive power is concentrated between aperture stop A and image plane to provide high image side numerical aperture, typically with NA≧0.85 for a dry system or NA>1 for an immersion system.

In the arrangement schematically shown in FIG. 13(*b*) the catadioptric imaging system CIS is inserted between a refractive relay system RS creating a first intermediate image IMI1 from the pattern of the reticle and a focusing group FG similar to that shown in (a). Here, the relay system RS consists of first and second lens groups LG11, LG12 each having positive refractive power, between which a position for an aperture stop is provided where the chief ray crosses the optical axis. Magnification β is about 1:1, typically in the range $0.8 \leq |\beta| \leq 1.2$. Systems having a refractive relay system RS ahead of the catadioptric imaging system CIS allow for larger working distances between object plane OP and catadioptric imaging system CIS.

Figure 14:
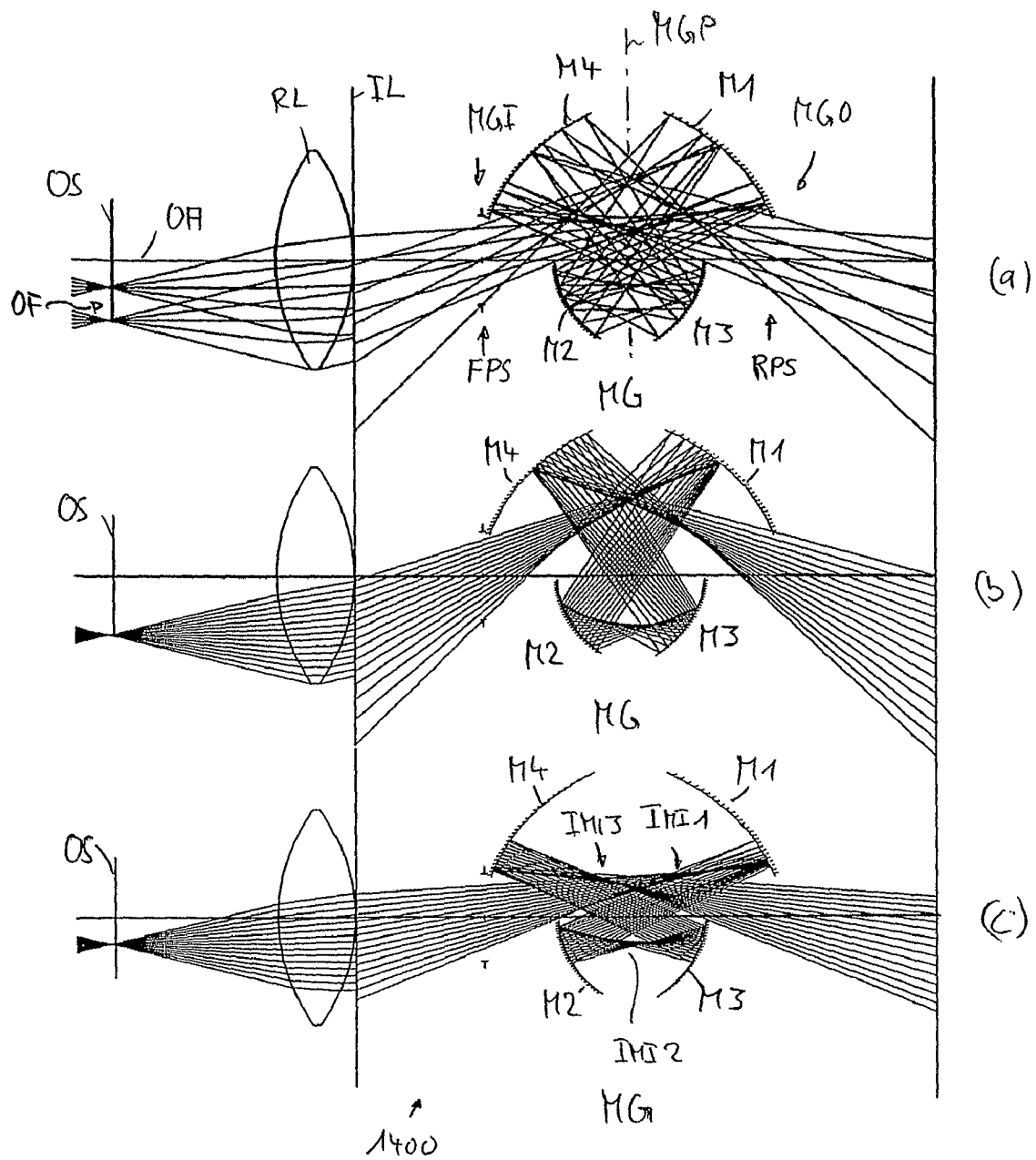
FIG. 14 shows an embodiment of an imaging system having four concave mirrors and forming three intermediate images within the mirror group.
Figure 15:
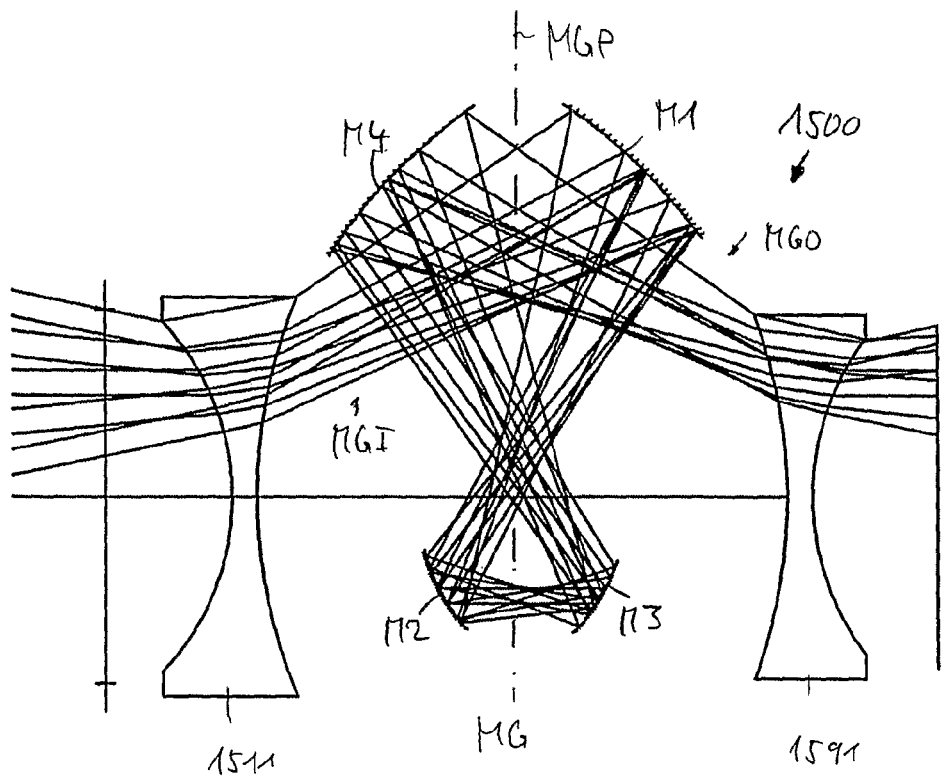
FIGS. 15, 16 show variants of the imaging system shown in FIG. 14.
Figure 16:
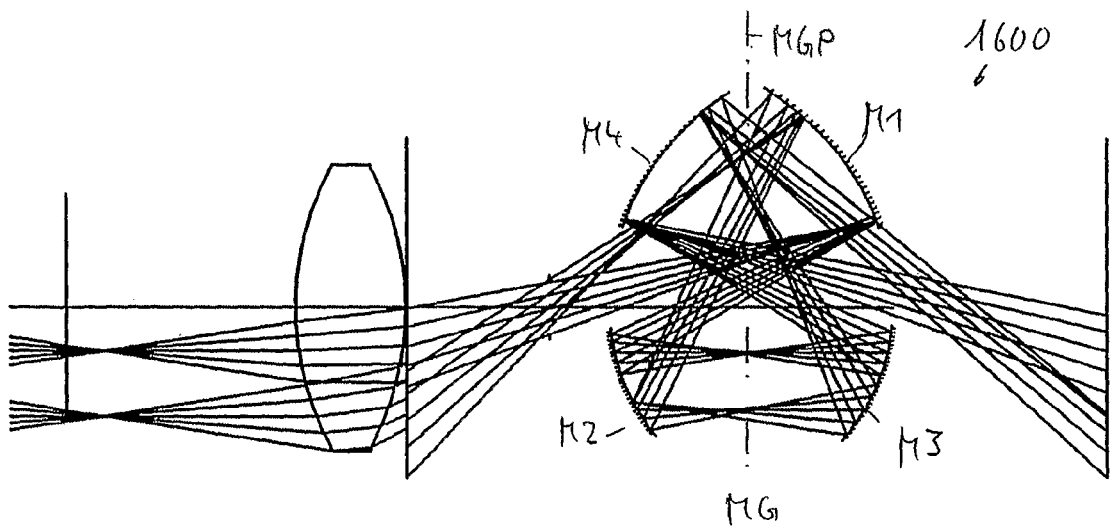

In FIGS. 14 to 16 further embodiments are shown which include an axially compact, purely reflective mirror group MG providing strong overcorrection of the Petzval sum counteracting opposite effects of positive refractive power of lenses upstream and/or downstream of the mirror group. If concave mirrors with their surface of curvature rotationally symmetric to the optical axis are used and an imaging free of obscuration and vignetting is desired, an off-axis object field OF must be used. In this type of imaging system it is desired that the inner field point of the off-axis object field (i.e. the field point closest to the optical axis OA) lies as close as possible to the optical axis. This condition is characterized by an object side numerical aperture $NA_o$ which should be around $NA_o = 0.30$ and by a field height of the innermost field point which can be imaged without vignetting. In this respect, it is desirable to have this inner field height be less than about 50% of the object field diameter such that a rectangular field can be imaged without vignetting.

In order to solve this problem systems having a mirror group MG having four separate concave mirrors M1 to M4 are shown in the embodiment of FIG. 14. In this figure showing a system 1400, partial figure (a) shows the beams from the outer edges of the object field OF through the system, wherein (b) shows the beam of the outer field point and (c) shows the beam from the inner field point. The object placed in the object surface OS is imaged by a combination of a real lens RL and an ideal lens IL onto the mirror group MG. The mirror group MG consists of a first mirror M1 placed on the side of the optical axis opposite to the object field, a second mirror M2 placed on the object field side of the optical axis, a third mirror M3 also placed on the object field side of the optical axis, and a fourth mirror M4 placed on the side opposite to the object field. A finite axial distance (vertex distance) exists between the intersection of the surfaces of curvature of the most object side mirror (M4) and the mirror geometrically following thereon (M2) on the opposite side of the optical axis. A mirror group entry MGI is formed therebetween. As the mirror arrangement is mirror symmetric to a symmetry plane (mirror group plane MGP) perpendicular to the optical axis, symmetric conditions are given on the exit side, where a mirror group exit MGO is formed between the third mirror M3 closer to the object and the first mirror M1 closest to the image side. Due to the symmetry of the mirror group, a front pupil surface FPS is positioned near the mirror group entry, whereas an optically conjugate rear pupil surface RPS lies near the mirror group exit. Inside the mirror group, three intermediate images (corresponding to field surfaces) are positioned. The first intermediate image IMI1 is positioned ahead of the first reflection at M1, a second intermediate image IMI2 is positioned between the second and third reflection between mirrors M2 and M3 and a third intermediate image IMI3 is positioned immediately downstream of the fourth reflection at M4. The mirror group plane is passes five times by radiation. In this arrangement, all concave mirrors are close to field surfaces, therefore providing predominantly correction for field aberrations.

The mirror group MG allows for a very large geometrical light guidance value (etendu). The object side numerical aperture is $NA_o = 0.3$. On the image side, a numerical aperture NA=1.2 can be achieved if a focusing group having appropriate reduction ratio and an immersion fluid between the exit thereof and the image plane is used. The inner most object field point, which can be imaged without vignetting lies at about 40% of the object field diameter. In this particular embodiment, the larger mirrors placed on the opposite side of the object field (mirrors M1 and M4) are conical mirrors, whereas the smaller mirrors (arranged closer together on the object field side (mirrors M2 and M3) are spherical mirrors. Deviations from this symmetry can be provided to improve correction of pupil aberration. This can be obtained by using one or more aspheric mirror surfaces and/or by deviations from the constructive symmetry of the mirror group arrangement. The potential of the mirror group to transmit a large field at a large numerical aperture (expressed by a high value of etendu) is partly due to the fact that there exists a large axial distance (vertex distance) between the vertices of the mirrors on the entry side (mirrors M2 and M4) and on the exit side (mirrors M1 and M3). Providing an incoming beam, which is tilted obliquely to the optical axis, this allows that a large field can be "threaded" trough the mirror arrangement without vignetting.

In the variant of a catadioptric imaging system 1500 shown in FIG. 15, the positive refractive power upstream and downstream of the mirror group MG of FIG. 14 is replaced by negative refractive power provided by biconcave negative lenses 1511, 1591. In this form, the catadioptric imaging system forms a 1:1 relay-system having a virtual object and image position. It is to be noted that there is no intersection between a chief ray and the optical axis OA in the vicinity of the mirror group MG. Consequently, a pupil surface cannot be placed near the mirror group entry or mirror group exit. Therefore, the field size and numerical aperture "transported" by this mirror group is smaller than those in the system of FIG. 14. In the embodiment of FIG. 15, the object side numerical aperture $NA_o = 0.2$ and the object field extends between about 80% and about 100% of the object field radius. A ring field can be transported with this arrangement. All mirrors M1 to M4 are conical mirrors, i.e. are aspherical mirrors.

The embodiment of an image system 1600 in FIG. 16 shows that systems based on the principles mentioned above can be designed having object side mirrors and image side mirrors each having the same axial position of the intersection of the concave surface of curvature with the optical axis. Since the image side mirrors M1 and M3 are used essentially concentric, whereas the object side mirrors M2 and M4 are used eccentric, in this embodiment the four mirrors M1 to M4 are separate mirrors having different curvatures. In a variant where mirrors M2 and M4 on the one side and mirrors M1 and M3 on the other side have identical refractive power, it is possible to form the object side mirrors M2 and M4 on one mirror substrate having a central aperture, whereas mirrors M1 and M3 on the image side are also formed on another common substrate having a central aperture. Considering the transported field size and numerical aperture it is to be noted that the object side numerical aperture $NA_o = 0.15$ and the object field extends between about 40% and about 100% of the object field radius. Therefore, the etendu of the system is smaller than of the system in FIG. 14.

In the embodiments of FIGS. 14 to 16 the length ratio LR between mirror group length MGL (axial distance between the mirror vertex closest to the object surface and mirror vertex closest to the image surface) and total track length TT is less than 50%.

Using the embodiments of FIGS. 14 and 16 as examples, some basic considerations for obtaining a high geometrical light guidance value (etendue, product of numerical aperture and corresponding field size) for the effectively used field are presented in the following. As explained above, radiation enters these four-mirror-designs at a mirror group entry MGE geometrically close to a pupil surface (front pupil surface FPS), and the mirror group exit MGO is also geometrically close to a pupil surface (rear pupil surface RPS) indicating that the mirror group performs a pupil imaging within the optical system. Further, each of the mirror surfaces is positioned optically close to a field surface (intermediate image) in a sense that the mirror is optically closer to a field surface than to a pupil surface of the object system. In order to avoid vignetting of the beam in the region of the pupil surface, the beam must pass the geometrically closest edge of the mirrors forming the mirror group entry or mirror group exit. Regarding the footprints of the beams on the mirrors care must be taken that the entire footprint falls on a reflective area of the mirror instead of passing the edge of a mirror, which would cause vignetting. A further practical requirement is to obtain a sufficiently large object field as close as possible to the optical axis in order to minimize the object field diameter, for which the projection objective must be sufficiently corrected. Under these conditions, it has been found useful to design the optical systems such that the size of the pupil (i.e. the beam diameter of the beam at a pupil surface) is as small as possible at a pupil plane geometrically close to the mirror group entry and mirror group exit. A small pupil in this area allows to place a geometrically close field (on or near an adjacent mirror) as close as possible to the optical axis without hitting the mirror edge. Further considering that the product of paraxial chief ray angle CRA and the size of a pupil is a constant in an optical imaging system (Lagrange invariant) a small pupil corresponds to large chief ray angles at that pupil surface. In this context it has been found useful for catadioptric in-line systems having mirror groups of the type shown here that the maximum chief ray angle $CRA_{max}$ should exceed a critical value, thereby allowing to form a small pupil and an oblique beam path in the vicinity of a mirror group entry and mirror group exit which, in turn, allows to place a large off-axis object field close to the optical axis even at high numerical apertures.

The maximum chief ray angle $CRA_{max}$ at the front pupil surface FPS close to the mirror group entry is about 28° in FIG. 14 and about 40° in FIG. 16. Useful values for $CRA_{max}$ may be in the range between about 20° and about 50°. At lower values, the pupil size increases such that it becomes more difficult to avoid vignetting without increasing the object field diameter to be corrected. At values higher than the upper limit, mirror surfaces may have to extend too far away from the optical axis thereby enlarging the mirror group size in radial direction and making mirror manufacturing and mounting more difficult.

Figure 17:
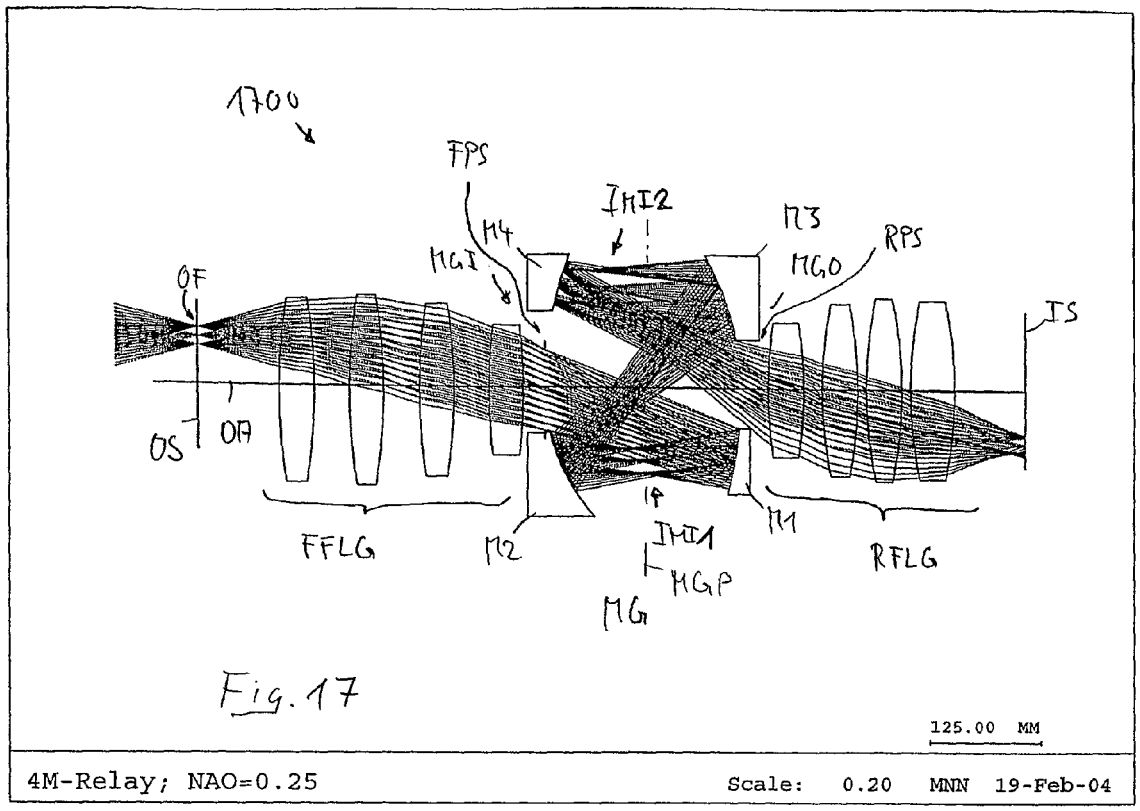
FIG. 17 shows an embodiment of an imaging system where two intermediate images are formed within the mirror group and the entry and exit of the mirror group are close to pupil surfaces.

In FIG. 17 another embodiment of a catadioptric imaging system 1700 having a mirror group MG for Petzval overcorrection is shown. It can be used as a four-reflection-relay-system for imaging an off-axis object field OF from the object surface OS into the image surface IS at a magnification close to unity while, at the same time, providing strong overcorrection of Petzval sum. The system includes, in that sequence, a front Fourier lens group FFLG, a mirror group MG and a rear Fourier lens group RFLG. The mirror group includes a first off-axis mirror M1 having an object side mirror surface, a second concave mirror M2 having an image side reflecting surface, a third concave mirror M3 on the other side of the optical axis having an object side mirror surface and a fourth concave mirror M4 on the object side having an image side mirror surface. A mirror group entry MGI is provided between the second and fourth mirror on the object side, whereas a mirror exit MGO is provided on the image side between the first and third mirror.

The front Fourier lens group FFLG having positive refractive power creates a front pupil surface FPS near the mirror group entry MGI, and in combination with the first mirror M1 a first intermediate image IMI1 is formed geometrically and optically between the first and second mirror. The second and third mirrors M2 and M3 form another imaging system forming a second intermediate image IMI2 geometrically and optically between the third and fourth mirror. Intermediate image IMI2 is imaged onto the image surface by the combined action of fourth mirror M4 and the rear Fourier lens group RFLG, while creating a rear pupil surface RPS at the mirror group exit. With other words, the mirror group MG performs a pupil imaging of the front pupil surface FPS at the mirror group entry onto the rear pupil surface RPS on the mirror group exit while creating one intermediate pupil surface optically between the second and third mirror. The mirror group plane MGP arranged half-way between mirrors M1, M3 on one side and M2, M4 on the other side is passed five times by the radiation.

Since the mirror group entry next to the secondary mirror M2 lies close to a pupil surface rather than a field surface, a large object side working distance between the mirror group MG and the object surface can be provided. Therefore, a reticle stage of a catadioptric projection objective might be arranged at the object surface OS without interfering with the mirror group. Since four reflections at concave mirrors are provided, strong Petzval overcorrection can be obtained with relatively small mirror curvatures. Optionally, the four reflections may be obtained by two, three or four different mirrors, which may optionally be aspheric or spheric. In order to obtain a complete catadioptric projection objective a refractive focusing group may be provided downstream of the image surface IS allowing an appropriate reduction ratio (for example 4:1) to obtain high image side numerical aperture NA suitable for microlithography.

Further embodiments and advantages of placing a pupil surface close to the mirror group entry and mirror group exit are described in connection FIGS. 18 and 19.

Figure 18:
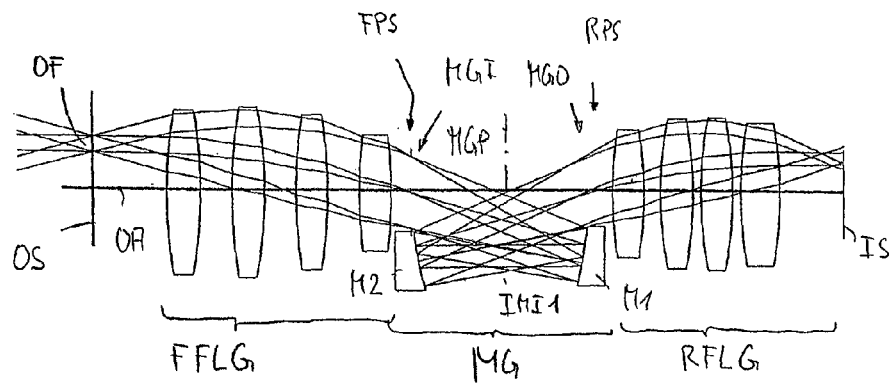
FIG. 18 shows a variant of the imaging system of FIG. 17 having a mirror group with two concave mirrors and one intermediate image.
Figure 19:
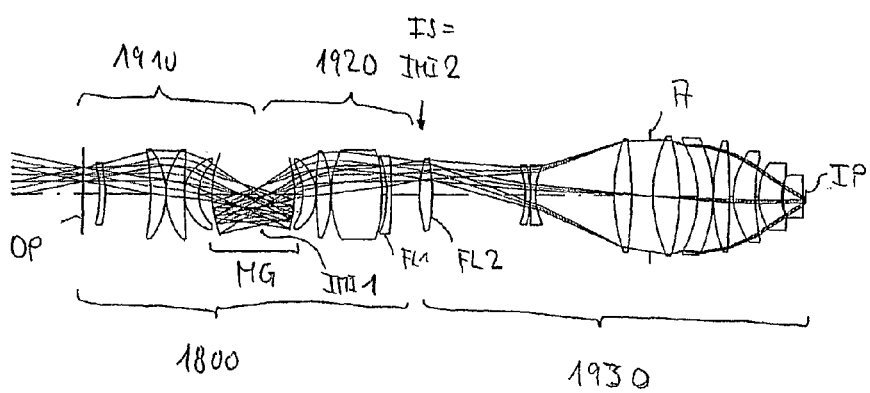
FIG. 19 shows a catadioptric projection objective including an imaging system according to FIG. 18 for Petzval sum correction.

In FIG. 19 an embodiment of a projection objective 1900 is shown. FIG. 18 shows a detailed view of an imaging system 1800 arranged between the object plane OP and the second intermediate image IMI2 which is the object of a purely refractive objective part 1920 for imaging the second intermediate image onto the image plane IP at a reduced scale of about 1:4.

The entire projection objective 1900 designed to image an object disposed in the object plane OP onto the image plane IP at a reduced scale consists of three objective parts 1910, 1920, 1930, each designed to image a field plane upstream of the objective part into field plane down-stream of the objective part. The first objective part 1910 consists of four consecutive lenses forming a front Fourier lens group FFLG followed by the first concave mirror M1 immediately upstream of the first intermediate image IMI1. Therefore, the first objective part is catadioptric. The second objective part 1920 is also catadioptric, including the second concave mirror M2 immediately downstream of the first intermediate image IMI1 and positive lenses forming a rear Fourier lens group RFLG, all effective for refocusing the first intermediate image IMI1 into the second intermediate image IMI2. The third objective part 1930 is purely refractive and includes the freely accessible aperture stop A of the system.

The first intermediate image IMI1 is positioned in the intermirror space defined by the concave mirrors M1, M2, whereas the second intermediate image IMI2 lies outside of this intermirror space. The mirror group MG defined by the two concave mirrors facing each other has a mirror group entry MGI and a mirror group exit MGO. At the mirror group entry positioned geometrically next to the edge of the second mirror M2 facing the optical axis OA radiation coming from the object side enters the intermirror space and at the mirror group exit positioned geometrically next to the edge of the first mirror M1 facing the optical axis the radiation exits the intermirror space after two reflections on the concave mirrors. It is a characterizing feature of this embodiment that a front pupil surface FPS of the projection objective lies in the vicinity of the mirror group entry and a rear pupil surface RPS lies in the vicinity of the mirror group exit. In the embodiment shown in FIGS. 18 and 19 the first and second concave mirrors M1, M2 are disposed on the same side of the optical axis OA. The optical path within the space defined by the concave mirrors is almost mirror-symmetric with respect to a mirror plane perpendicular to the optical axis and arranged midways between vertices of the concave mirrors M1, M2. The length ratio LR between mirror group length MGL (axial distance between the mirror vertex closest to the object surface and mirror vertex closest to the image surface) and total track length TT is only about 10% to 15% here, indicating a very compact mirror group.

Optically, embodiments designed essentially according to the principles of the embodiment shown in FIGS. 18, 19 can be advantageous if it is desired to influence field aberrations by the action of lenses close to field surfaces since one of the field surfaces between object plane OP and image plane IP, namely the field surface of the second intermediate image IMI2 is arranged freely accessible at a distance outside the intermirror space defined by the concave mirrors M1, M2. As shown in FIG. 19, two field lenses FL1, FL2 are arranged close to the second intermediate image immediately upstream (negative power of FL1) and immediately downstream (positive power of FL2) of this intermediate image, thus forming a field lens group for aberration correction.

The first and second objective parts 1910, 1920 are effective to form an intermediate image IMI2 at a distance from the mirror group MG defined by the concave mirrors M1, M2 geometrically behind this mirror group. Since a pupil surface RPS is arranged in the vicinity or the exit of the mirror group, a group of lenses acting in combination as a Fourier-transforming lens group RFLG can be used to position and define the characteristics of the intermediate image IMI2, which then is reimaged on the image plane IP by the third objective part 1930. These properties make the optical imaging 1800 formed by the first and second objective part 1910, 1920 useful as a relay system for linking light paths of optical systems ahead and downstream of the relay system together. Due to the action of the concave mirrors M1, M2 of the mirror group MG this relay system can be designed to have strong influence on the image curvature compensating at least partly the opposite influence of positive lenses upstream and downstream of the mirror group.

The specification of the system shown in FIG. 19 is given in tables 19, 19A. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the optically utilizable, clear, semidiameter [mm] of the optical component.

In the case of this particular embodiment, nine surfaces, namely surfaces 2, 17, 18, 20, 22, 27, 29, 35 and 38 in table 19, are aspherical surfaces. Table 19A lists the associated data for those aspherical surfaces, from which the rise (Pfeilhöhe) of their surface figures may be computed employing the following equation:

$$p(h)=[((1/r)h^2)/(1+SQRT(1-(1+K)(1/r)^2h^2))]+C1*h^4+C2*h^6+\ldots,$$

where the reciprocal value (1/r) of the radius is the curvature of the surface in question at the surface vertex and h is the distance of a point thereon from the optical axis. The rise p(h)

thus represents the distance of that point from the vertex of the surface in question, measured along the z-direction, i.e., along the optical axis. The constants K, C1, C2, etc., are listed in Table 19A.

The projection objective of FIG. 19 including a two-mirror-relay-system is designed for 193.3 nm. All lenses are made of fused silica (n=1,56049). An image side numerical aperture NA=0.8 is obtained for a reduction ratio 4:1. The system is designed as a dry-system, gas filling the image side working distance between the exit surface and the image plane in operation.

In FIG. 20 a variant of the system shown in FIG. 18 is shown. The mirror group MG designed for performing a pupil imaging of a pupil surface FPS at the mirror group entry MGI into a pupil surface RPS at the mirror group exit MGO has mirrors arranged and used such that six reflections at concave mirror surfaces occur and three intermediate images are formed between mirror group entry and mirror group exit and three intermediate images are formed.

The mirror group MG has four mirror substrates forming six reflecting areas spaced apart from each other. The most objectwise mirror substrate forms the second mirror M2 in the lower part and the fourth mirror M4 in the upper part and includes a central aperture forming the mirror group entry MGI. The most imagewise mirror substrate forms the third mirror M3 at its upper part and the fifth mirror M5 at its lower part and has a central aperture forming the mirror group exit MGO. Between these concave mirrors, a first mirror M1 having an object side reflecting surface and a sixth mirror M6 having an image side reflecting surface are arranged in the middle region of the mirror group. A positive lens L is arranged on the optical axis OA geometrically between the first and sixth mirror and optically between the second and third mirror and between fourth and fifth mirror, thus beingtransited twice from object to image side.

Radiation entering the mirror group entry obliquely is reflected by first and second mirror M1 and M2 prior to crossing the optical axis towards mirror M3. A first refraction at central lens L occurs between mirrors M2 and M3. Radiation reflected from third mirror to fourth mirror M4 transits the central lens L a second time before impinging on mirror M5. Radiation reflected from mirror M5 is incident on mirror M6 before exiting the mirror group at the mirror group exit obliquely to the optical axis. It is evident that the beam path including two beam crossings is essentially mirror symmetric to a symmetry plane coinciding with the central lens L such that the off-axis object field OF is on the same side of the optical axis as the off-axis image field IF. A mirror group plane MGP arranged geometrically between first mirror M1 and second mirror M2 is transited five times. Alternatively, a mirror group plane transited five times may also be defined geometrically between the fifth and six mirror M5 and M6. Since the entry and exit of the mirror group are close to pupil surfaces a large object side and image side working distance to the field surfaces closest to the mirror group is provided.

In this embodiment, all mirrors have the same radius of curvature, which facilitates manufacturing. Also the mirror pair M2/M4 and the mirror pair M3/M5 may each be formed on a common mirror substrate having an aperture on the optical axis. The central lens L is provided for controlling the positions of the intermediate images IMI1 optically and geometrically between mirrors M1 and M2 and IMI3 optically and geometrically between mirrors M5 and M6 and IMI2 optically and geometrically between mirrors M3 and M4. In analogy to the projection objective shown in FIG. 19 a refractive focusing system may be arranged downstream of the image surface IS to form a complete rotational-symmetric catadioptric projection objective having a catadioptric in-line Petzval corrector formed by the mirror group MG.

In FIG. 21 an imaging system 2100 is shown which can be considered as a variant to the embodiments shown in FIG. 17 or 20. Between an object side Fourier lens group FFLG and an image side Fourier lens group RFLG a mirror group MG is positioned such that the mirror group entry MGI and the mirror group exit MGO are positioned optically near pupil surfaces FPS, RPS of the imaging system. Two truncated positive lenses L1, L2 are arranged outside the optical axis OA geometrically between the first mirror M1 and the fourth mirror M4 such that radiation crossing the optical axis between first mirror M1 and second mirror M2 or between third and fourth mirrors M3 and M4 is not vignetted by the lenses.

Radiation entering the mirror group obliquely to the optical axis at the mirror group entry MGI transits both positive lenses L1, L2 prior to impinging on the first concave mirror M1, from which radiation is reflected across the optical axis to mirror M2 and, parallel to the optical axis, to mirror M3 prior to crossing the optical axis again towards mirror M4. Radiation reflected from concave mirror M4 and running essentially parallel to the optical axis transits the positive lenses L1, L2, which are effective to bend the beam obliquely to the optical axis such that the exiting beam passes the mirror group exit MGO without vignetting. When compared to the arrangement of FIG. 20 it is obvious that only four reflections on concave mirrors are used to provide Petzval correction. There is no need to provide a central lens L on the optical axis. Refractive power suitable to adjust the positions of three intermediate images IMI1, IMI2 and IMI3 disposed essentially symmetrically within the catadioptric cavity is provided by the off-axis truncated lenses L1 and L2, which can be mounted by a mounting not interfering with the beam path within the mirror group. Positive refractive power provided by lenses L1, L2 is arranged optically near intermediate images, whereby primary effects are obtained on field aberrations.

In FIG. 22 an alternative embodiment of a catadioptric imaging system 2200 is shown where positive refractive power is provided by a central biconvex positive lens L arranged essentially at a symmetry plane of mirror symmetry of the mirror group MG (where the mirror group plane MGP is defined). Similar to the embodiment of FIG. 21, the mirror group entry MGI and the mirror group exit MGO are close to pupil surfaces FPS, RPS of the imaging system. The central positive lens L provides positive refractive power between mirror group entry and the first mirror M1, between the first and the second mirror M2 between the second and the third mirror M3, between the third and the fourth mirror M4 and between the fourth mirror and the mirror group exit MGO. Therefore, positive refractive power is arranged at different positions along the beam path within the catadioptric cavity defined by the object side mirror M2/M4 and the image side mirror M1/M3. The refractive power is divided between positions close to field surfaces (outer edge of central lens L close to intermediate images) and positions close to pupil surfaces (central part of lens L optically between first and second mirror and third and fourth mirror). Providing a central lens (or lens group) covering the entire diameter of the mirror group facilitates mounting of the lens and avoids problems due to vignetting. A larger geometrical light guidance value can be transported this way.

The catadioptric imaging system of FIG. 22 which may be used as a Petzval sum correcting relay system, has an object side numerical aperture $NA_o=0.3$ and the object field OF extends between 40% and 100% of the object field radius.

Like in the embodiments shown before, the object side mirrors M2/M4 and the image side mirrors M1/M3 may each be formed on common mirror substrates having a central aperture serving as mirror group entry and mirror group exit, respectively. It is also possible to split the central lens L into two or more single lenses having a certain distance to each other. This can be useful for achieving that the three intermediate images IMI1, IMI2 and IMI3 occurring at the first, third and fifth transit of the lens can be positioned outside the lens body in order to avoid increased energy densities within the lens material.

FIGS. 23 to 26 show embodiments of catadioptric imaging systems for 193 nm where a mirror group providing six consecutive reflections are provided and different numbers of intermediate images are formed. In the coaxial systems the surfaces of curvature of all curved mirrors have a common axis of rotational symmetry on the optical axis, a circular pupil and no planar folding mirrors.

In all embodiments a first concave mirror M1 having an object side mirror surface is arranged on the optical axis OA for reflecting radiation from the mirror group entry MGI to a second mirror M2 arranged outside the optical axis on the opposite side to the off-axis object field OF. Mirror M2 is convex in FIGS. 23 to 25 and concave in the embodiment of FIG. 26. A third mirror M3 placed on the same side farther outside the optical axis has an object-side mirror surface for reflecting radiation coming from mirror M2 roughly parallel to the optical axis OA onto concave mirror M4 having an image-side mirror surface. Radiation is reflected from mirror M4 towards the optical axis to mirror M5 placed on the same side of the optical axis and having an object-side reflecting surface which reflects radiation to concave mirror M6 arranged on the side of the object field OF and having a concave mirror surface facing the image surface to reflect radiation to the mirror group exit MGO. A mirror group plane MGP geometrically between entry and exit of the mirror group and positioned e.g. between first and second mirrors M1, M2 is transited five times by radiation passing through the mirror group.

In all six-reflection embodiments the mirror group entry MGI and the mirror group exit MGO are close to field surfaces of the system and arranged on the same side of the optical axis. Whereas the object surface is the field surface closest to the mirror group entry in FIGS. 23 and 24, a refractive relay system RS having a magnification |β|>1 is arranged between the object surface OS and the mirror group entry to form a first intermediate image IMI1 in the vicinity of the mirror group entry MGE within the intermirror space defined between the surfaces of curvature of mirror M3 on the image side and mirror M4 on the object side.

Figure 23:
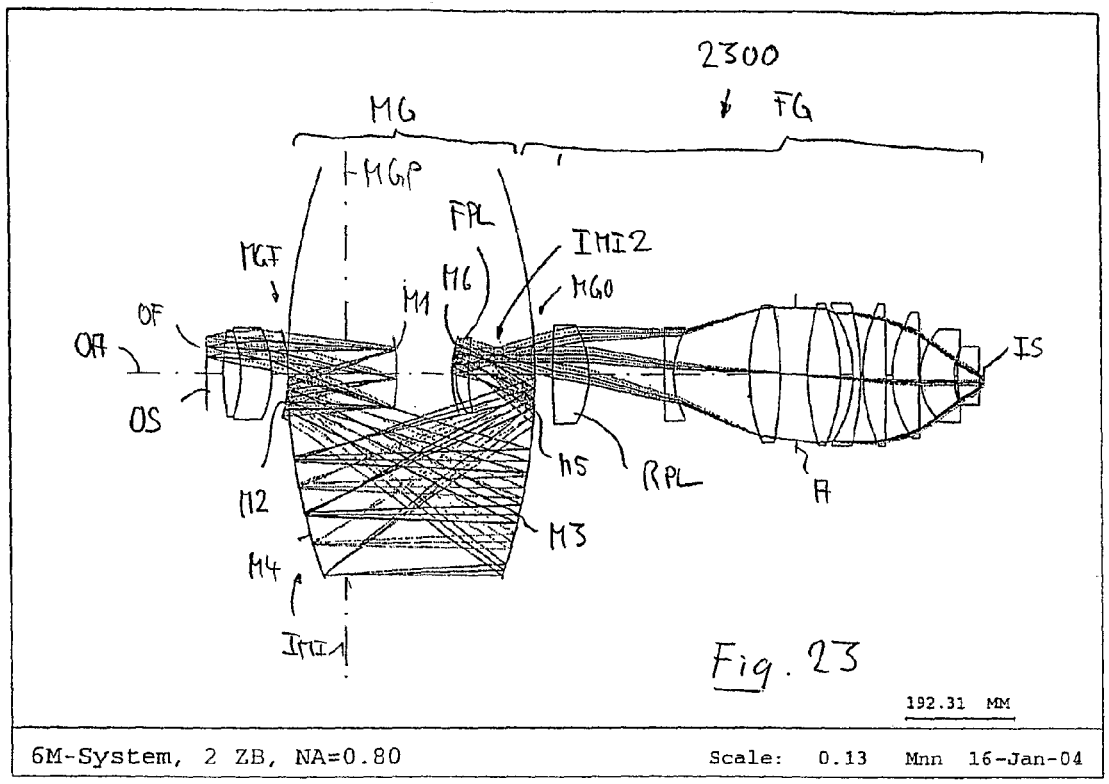
FIG. 23 shows an embodiment of a catadioptric protection objection having an imaging system with a mirror group of six mirrors providing six reflections.
Figure 24:
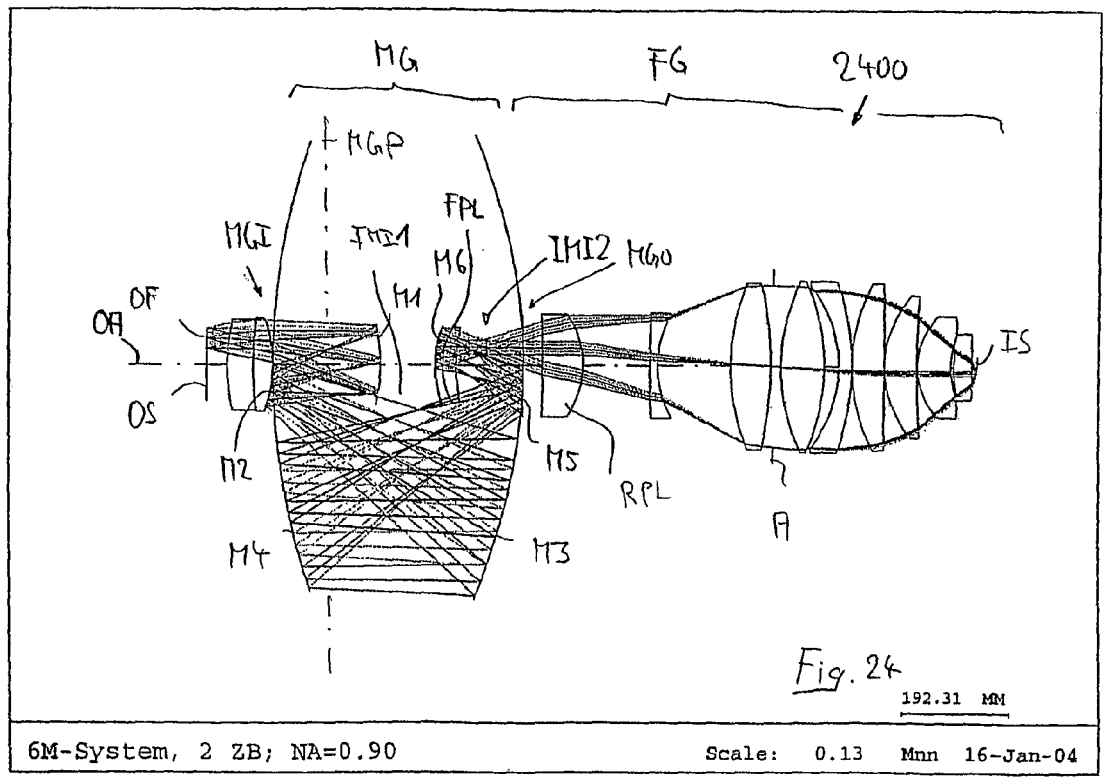
FIG. 24 shows a variant of the system of FIG. 23.

In the embodiments of FIGS. 23 and 24 two intermediate images are formed within the mirror group, a first intermediate image IMI1 positioned optically between mirrors M4 and M5 close to mirror M4 and a second intermediate image IMI2 optically behind mirror M6 within the intermirror space. The second intermediate image IMI2 forms the object of the refractive focusing group FG which has an reduction ratio of about 4:1 providing an image-side numerical aperture of the system of NA=0.8 (FIG. 23) or NA=0.9 (FIG. 24). The rectangular field has a field size of 5×22 mm$^2$ in FIG. 23 and 5×26 mm$^2$ in FIG. 24.

Figure 25:
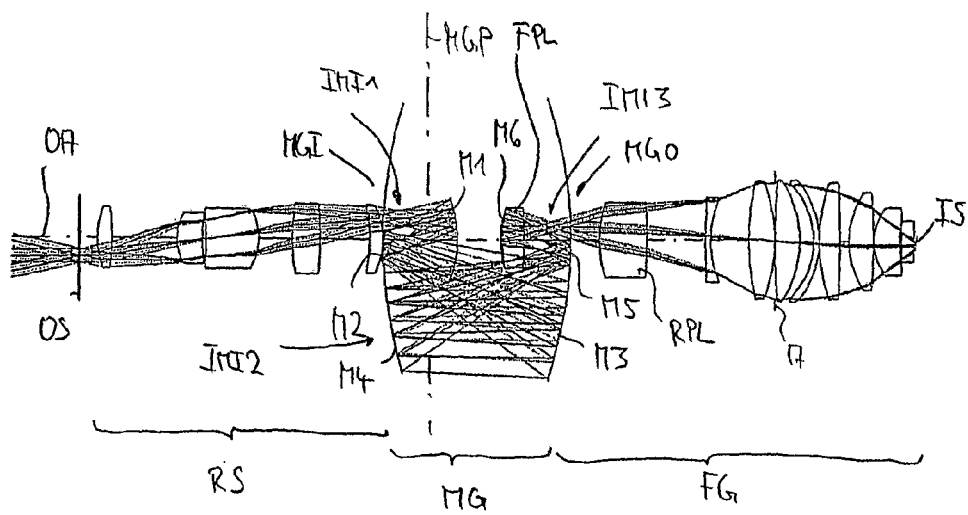
FIG. 25 shows an embodiment of a catadioptric imaging system forming three intermediate images where a mirror group providing six reflections is arranged between an object side refractive relay system and an image side refractive focusing group.
Figure 26:
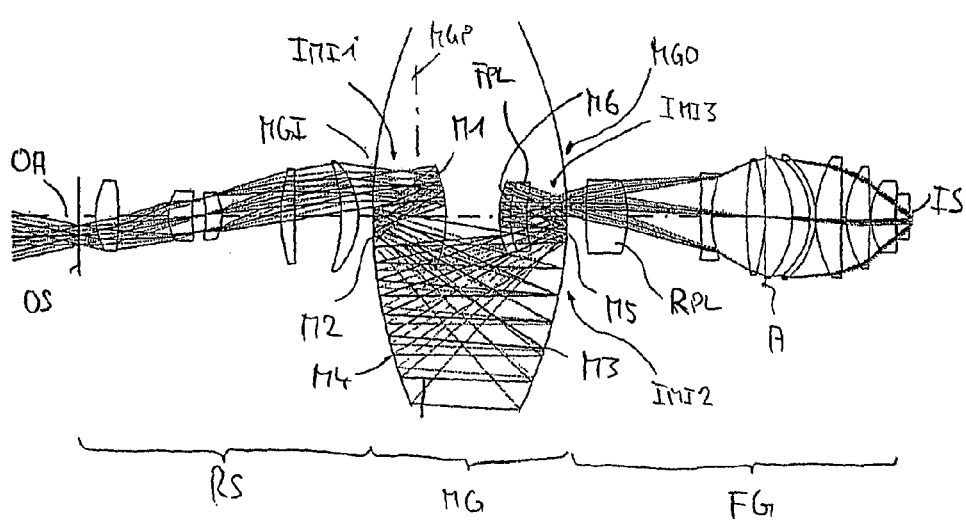
FIG. 26 shows a variant of the system of FIG. 25.

Due to the refractive relay upstream of the mirror group the optical systems of FIGS. 25 and 26 have three intermediate images. A first intermediate image IMI1 is formed by the relay system RS immediately downstream of the mirror group entry. A second intermediate image IMI2 is formed optically downstream mirror M2. A third intermediate image IMI3 is formed optically downstream mirror M6 in the vicinity of the mirror group exit MGO. The third intermediate image is the object of the focusing group FG providing an image-side numerical aperture NA=0.9 for both embodiments at a field size of 5×22 m$^2$ (FIG. 25) and 8 26 mm$^2$ (FIG. 26).

Providing at least two intermediate images within the mirror group MG in this type of 6 mirror-systems allows for a relatively large object side working distance between the object surface OS and the most object side mirror of the mirror. Limitations on numerical aperture found in prior art systems having only one intermediate image can be relaxed. Also, the further intermediate image (intermediate image IMI2 in FIGS. 23 and 24 or intermediate image IMI3 in FIGS. 25, 26) allows for a better correction of field-dependent aberrations using lenses optically near the field surface at the intermediate image. Note, that in all embodiments a front positive lens FPL is arranged between the sixth mirror M6 and the last intermediate image within the mirror group and a rear positive lens RPL is arranged immediately downstream of this intermediate image (which is intermediate image IMI2 in FIGS. 23 and 24 and intermediate image IMI3 in FIGS. 25, 26).

It is worth to note that the mirror groups of these systems have a highly symmetric arrangement of mirror surfaces being approximately mirror-symmetric to a symmetry plane orthogonal to the optical axis and placed in the middle of the mirror group. Negative influence on polarization of the mirror group can thereby be reduced when compared to asymmetric systems. In the embodiments of FIGS. 23, 24 the largest incidence angles of radiation are found on mirrors M2 and M5. These mirrors are crucial for polarization-dependent image aberrations which generally increase with higher incident angles. However, the particular arrangement of these mirrors in the embodiments allows a mutual compensation of these image aberrations. For example, an upper coma ray on mirror M2 has a larger incidence angle, but has a small incidence angle on mirror M5. The opposite holds for the lower coma ray on the other side of the beam bundle, whereby aberrations caused by high incidence angles on mirrors M2 and M5 can at least partly be compensated. As used here, a "coma ray" is a ray running from a field point at the edge of the object field to the edge of the aperture stop. The existence of phase compensation mirror pairs is one beneficial feature of these embodiments.

Although the embodiments of FIGS. 23, 24 can be used at high numerical apertures, it is difficult to avoid vignetting particularly at the second mirror M2. It is evident that the object side working distance (axial distance between object surface and the vertex of the most object mirror) cannot be increased for a given object side numerical side aperture NA$_O$ without vignetting at mirror M2. Therefore, a limitation to the geometrical light guidance value transported by the system exists. If it is desired to allow for larger field size and/or larger numerical apertures, for example useful for immersion lithography at image side numerical apertures NA>1, the maximum field radius should be increased. These requirements, in turn, will lead to higher lens diameters and higher mass requirement. Moreover, aspheric surfaces might be required which are difficult to manufacture. Embodiments having the general features of the systems shown in FIGS. 25, 26 (e.g. refractive relay system, six reflections, three intermediate images) are beneficial to overcome these difficulties. As mentioned above, these systems are based on the embodiments shown in FIGS. 23, 24, however, a refractive subsystem (relay system RS) is provided for imaging the object field from the object surface into first intermediate image IMI1 in the vicinity of the mirror group entry. The position of the first intermediate image is adjusted such that it is arranged optically upstream of the first imaging mirror M1 of the second, catadioptric partial system formed by the mirrors of the mirror group MG and front positive lens FPL immediately upstream of the third intermediate image IMI3. Geometrically, the first intermediate image is positioned between the first and the second mirrors. This allows that the region of minimum beam diameter is positioned exactly where it is needed for an obscuration-free guidance of the beam clear of the second mirror M2. The aperture is limited by the lower coma ray of the inner field point which is incident almost perpendicularly on the first mirror. The length ratio LR between mirror group length MGL (axial distance between the mirror vertex closest to the object surface and mirror vertex closest to the image surface) and total track length TT is between 30% and 40% in FIGS. 23, 24 and between 20% and 30% in FIGS. 25, 26, indicating axially compact mirror groups.

Preferably, the magnification ratio of the relay system RS can be adjusted such that this field point having the smallest distance to the optical axis can be imaged without vignetting. This effect can be seen, for example, in the embodiment of FIG. 26 where the relay system has a magnification $|\beta|>1$ such that the first intermediate image is larger than the object field, but the numerical aperture at the intermediate image 1 is smaller than the object side numerical aperture. This facilitates that the beam passes mirror M2 without vignetting. The magnifying relay systems RS has a magnification $\beta=-1.2$ in FIG. 25 and $\beta=-1.6$ in FIG. 26. Generally, the magnification ratio will be selected higher for larger field sizes and/or for smaller distances between the inner field point and the optical axis.

The curvatures of mirrors M2, M3, M4 and M5 are rather small which facilitates manufacturing of the mirrors, particularly if aspheric mirror surfaces should be desired. Also, mirrors M2, M4 on the object side and mirrors M3, M5 on the image side are positioned pair-wise relatively close together. Particularly, the vertex distance is almost zero in the embodiments shown. In other embodiments, mirrors M2 and M4 on the object side and mirrors M3 and M5 on the image side are each formed pair-wise on a common mirror substrate and have the same surface of curvature. In this case, only four instead of six separate mirrors must be manufactured. This also facilitates mounting of the mirrors. Also, whereas with separate mirrors a separation of the beam bundle on the mirror surfaces is necessary, a beam separation is not necessary if the mirrors M2, M4 and/or the mirrors M3, M5 are used as multiply reflecting mirrors where the footprints of the reflections on these mirrors overlap at least partially. Using the mirrors as multiply reflecting mirrors also allows for smaller mirror diameters, such facilitating manufacturing. Image aberration correction can also be facilitated, since two limiting conditions for geometry control can be dispensed with. These advantages are counter-balanced by the fact that degrees of freedom for correction are lost when multiple reflecting mirrors are used. It may be useful to form only one pair of mirrors (M2/M4 or M3/M5) as a multiple reflecting mirror and the other pair as separate mirrors. In this case, a system with five physically separate mirrors is provided.

TABLE 19

| Surface | Radius | Thickness | Material | ½ Diam. |
|---|---|---|---|---|
| 1 | 0.000000 | 32.000000 | | 54.000000 |
| 2 | −265.462991 | 10.955266 | 'SILUV' | 58.944056 |
| 3 | −320.941675 | 92.726243 | | 62.093826 |
| 4 | −485.505902 | 31.212968 | 'SILUV' | 87.189838 |
| 5 | −156.409891 | 0.100000 | | 89.794429 |
| 6 | 150.365558 | 36.707776 | 'SILUV' | 90.071542 |
| 7 | 1178.779603 | 0.100000 | | 87.563747 |
| 8 | 77.959865 | 29.679401 | 'SILUV' | 71.727337 |
| 9 | 86.936642 | 199.783480 | | 63.667278 |
| 10 | −259.984787 | −171.939970 | | 71.381328 |
| 11 | 218.260666 | 189.299306 | | 82.167439 |
| 12 | −124.923457 | 27.606962 | 'SILUV' | 63.527025 |
| 13 | −88.469656 | 0.100000 | | 70.201262 |
| 14 | 765.108232 | 31.023977 | 'SILUV' | 85.238061 |
| 15 | −241.482793 | 0.100000 | | 87.120113 |
| 16 | 208.741023 | 106.608015 | 'SILUV' | 90.112354 |
| 17 | −506.991635 | 9.920042 | | 80.961734 |
| 18 | −318.684779 | 10.014467 | 'SILUV' | 78.946971 |
| 19 | −876.645413 | 59.187237 | | 77.855906 |
| 20 | 208.400426 | 27.386571 | 'SILUV' | 72.072411 |
| 21 | −379.754807 | 191.056939 | | 72.258596 |
| 22 | −197.150836 | 10.923991 | 'SILUV' | 57.184096 |
| 23 | −214.923769 | 0.100000 | | 58.701010 |
| 24 | −4609.834573 | 10.353044 | 'SILUV' | 58.863340 |
| 25 | 143.119223 | 163.793190 | | 59.282215 |
| 26 | 344.889255 | 36.942085 | 'SILUV' | 113.642165 |
| 27 | −749.449708 | 37.529937 | | 114.240025 |
| 28 | 0.000000 | 5.768809 | | 115.429814 |
| 29 | 255.712912 | 55.268563 | 'SILUV' | 120.945465 |
| 30 | −438.540996 | 38.553856 | | 120.490267 |
| 31 | −221.624231 | 31.986764 | 'SILUV' | 115.101504 |
| 32 | −277.194587 | 0.100000 | | 118.184609 |
| 33 | 332.527783 | 33.813301 | 'SILUV' | 111.726320 |
| 34 | −1679.493236 | 8.421103 | | 109.362778 |
| 35 | 135.204550 | 46.791018 | 'SILUV' | 91.893771 |
| 36 | 345.916009 | 8.033754 | | 79.919553 |
| 37 | 121.697394 | 48.277393 | 'SILUV' | 67.193723 |
| 38 | 96.620429 | 2.997292 | | 41.978258 |
| 39 | 135.992207 | 40.716568 | 'SILUV' | 41.976737 |
| 40 | 0.000000 | 6.000651 | | 21.558794 |
| 41 | 0.000000 | 0.000000 | | 13.500124 |

TABLE 19A

| | Aspherical Constants | | | | |
|---|---|---|---|---|---|
| Surface | K | A | B | C | D |
| 2 | 0.000000E+00 | −7.217117E−08 | −6.848649E−12 | 5.659624E−17 | −1.248493E−19 |
| 17 | 0.000000E+00 | −4.261063E−08 | −1.766409E−12 | −7.584619E−17 | 3.780218E−21 |
| 18 | 0.000000E+00 | −8.782032E−08 | −2.707678E−12 | 1.258606E−16 | 5.827849E−21 |
| 20 | 0.000000E+00 | −8.500029E−08 | −1.295518E−13 | −1.343587E−16 | −6.802121E−22 |
| 22 | 0.000000E+00 | −1.565494E−07 | −9.361496E−12 | −4.647921E−16 | −3.562386E−20 |
| 27 | −2.244481E+01 | 0.000000E+00 | 1.591265E−13 | −6.701196E−18 | −1.133815E−23 |
| 29 | 0.000000E+00 | −1.768969E−08 | −6.713660E−14 | −1.436686E−18 | 2.232866E−23 |
| 35 | −6.146561E−01 | 0.000000E+00 | −7.243174E−13 | −4.664471E−17 | −1.811484E−21 |
| 38 | 0.000000E+00 | 6.054733E−08 | −2.353895E−11 | −3.238477E−15 | 7.344606E−19 |

The invention claimed is:

1. An imaging system comprising:
a plurality of optical elements configured to image an off-axis object field arranged outside an optical axis of the imaging system in an object surface of the imaging system onto an off-axis image field arranged outside the optical axis in an image surface of the imaging system and creating at least one intermediate image;

the optical elements comprising at least one mirror group having an object side mirror group entry and an image side mirror group exit, the mirror group including:

a first mirror having a first mirror surface configured to receive radiation from the mirror group entry in a first reflecting area;

at least one second mirror having a second mirror surface facing the first mirror surface and configured to receive radiation from the first mirror in a second reflecting area;

at least one of the first and second mirrors being a concave mirror having a concave mirror surface having a surface of curvature defining a mirror axis on the optical axis;

wherein the mirrors of the mirror group are arranged such that radiation from the mirror group entry is reflected at least twice on given ones of the concave mirror surfaces of the mirror group prior to exiting the mirror group at the mirror group exit, and wherein the mirror group has at least one multiply reflecting mirror arranged such that a mirror surface of the multiply reflecting mirror is used twice at reflecting areas overlapping at least partially.

2. The imaging system according to claim 1, wherein the multiply reflecting mirror has a planar reflecting surface.

3. The imaging system according to claim 1, wherein the multiply reflecting mirror has a concave reflecting surface.

4. The imaging system according to claim 1, wherein the mirror group is a purely reflective mirror group.

5. The imaging system according to claim 1, wherein the mirror group includes:

a third mirror configured to receive radiation reflected from the second mirror on a third reflecting area; and a fourth mirror configured to receive radiation reflected from the third mirror in a fourth reflecting area and to reflect the radiation to the mirror group exit.

6. The imaging system according to claim 5, wherein each of the first, second, third and fourth mirrors is a concave mirror.

7. The imaging system according to claim 5, wherein either the first and third mirrors are planar mirrors and the second and fourth mirrors are concave mirrors, or the second and fourth mirrors are planar mirrors and the first and the third mirrors are concave mirrors.

8. The imaging system according to claim 1, wherein the mirror group includes at least one mirror pair consisting of two concave mirrors having mirror surfaces sharing a common surface of curvature provided on a common mirror substrate having a transmissive portion provided between the concave mirrors of the mirror pair.

9. The imaging system according to claim 8, wherein the transmissive portion is at least one of arranged eccentrically to the optical axis and formed by a hole in a mirror substrate.

10. The imaging system according to claim 1, wherein the mirror group has a number of mirrors which is less than the number of reflections within the mirror group.

11. The imaging system according to claim 1, wherein the mirror group includes an object side concave mirror having a mirror surface facing the image side and an image side concave mirror having a mirror surface facing the object side, the object side concave mirror and the image side concave mirror sharing a common mirror axis and being arranged eccentrically to the optical axis such that the mirror group entry is positioned besides the object side concave mirror and the mirror group exit is positioned besides the image side concave mirror on the same side as the mirror group entry, the concave mirrors being arranged such that radiation entering the mirror group obliquely to the optical axis at the mirror group entry is reflected twice on the object side concave mirror and twice on the image side concave mirror prior to exiting the mirror group at the mirror group exit.

12. The imaging system according to claim 1, wherein the mirror group has only two concave mirrors, each concave mirror being arranged to be used as a multiply reflecting mirror such that four reflections within the mirror group are effected with only two concave mirrors.

13. The imaging system according to claim 1, wherein at least one mirror of the mirror group is constructed as a front face mirror having a mirror substrate and a reflective coating on the mirror substrate, wherein a reflection occurs on the coating side opposite to the substrate.

14. The imaging system according to claim 1, wherein a front field surface of the imaging system is positioned in the vicinity of the mirror group entry and a rear field surface of the imaging system is disposed in the vicinity of the mirror group exit and at least one pupil surface of the imaging system is disposed optically between the mirror group entry and the mirror group exit.

15. The imaging system according to claim 14, wherein the mirror group is arranged close to the object surface such that the object surface essentially coincides with the mirror group entry.

16. The imaging system according to claim 14, wherein a front relay imaging system is arranged between the object surface and the mirror group such that an image surface of the front relay system essentially coincides with the mirror group entry.

17. The imaging system according to claim 1, wherein a front relay imaging system is arranged between the object surface and the mirror group, the front relay system having a magnification $\beta$ in the range of $0.8 \leq |\beta| \leq 1.2$.

18. The imaging system according to claim 1, wherein a rear imaging system is arranged between the mirror group and the image plane of the optical system.

19. The imaging system according to claim 18, wherein the rear imaging system is designed as a demagnifying optical system having a high NA image side.

20. The imaging system according to claim 1, wherein the imaging system has a magnification $\beta$ in the range of $0.8 \leq |\beta| \leq 1.2$ between the object surface and the image surface.

21. The imaging system according to claim 1, wherein all reflecting areas of the mirror group are non-symmetrical with respect to the optical axis.

22. The imaging system according to claim 1, wherein the imaging system has no planar folding mirrors inclined to the optical axis non-orthogonally.

23. The imaging system according to claim 1, wherein the mirror group has no convex mirror.

24. The imaging system according to claim 1, wherein the imaging system has a circular pupil.

25. The imaging system according to claim 1, wherein a length ratio between an axial mirror group length and a total track length of the imaging system is less than 50%, where the mirror group length is the axial distance between a mirror vertex closest to the object surface and a mirror vertex closest to the image surface and the total track length is the axial distance between the object surface and the image surface.

26. The imaging system according to claim 1, designed as a catadioptric projection objective for microlithography.

27. The imaging system according to claim 26, wherein the catadioptric projection objective has an image side numerical aperture NA>0.9.

28. The imaging system according to claim 26, wherein the catadioptric projection objective is designed as an immersion objective adapted with reference to aberrations such that an image side working distance between a last optical element and the image plane is filled with an immersion medium having a refractive index substantially greater than 1.

29. The imaging system according to claim 26, wherein the catadioptric projection objective is configured for use with ultraviolet light within a wavelength range extending from about 120 nm to about 260 nm.

30. A projection-exposure system for use in microlithography having an illumination system and a catadioptric projection objective, wherein the projection objective includes the imaging system configured according to claim 1.

31. A method for fabricating at least one of semiconductor devices and other types of microdevices, comprising:
  providing a mask having a prescribed pattern;
  illuminating the mask with ultraviolet light having a prescribed wavelength; and
  projecting an image of the pattern onto a photosensitive substrate arranged in the vicinity of the image plane of a projection objective using a catadioptric projection objective including the imaging system according to of claim 1.

* * * * *